United States Patent
Mosendz et al.

(10) Patent No.: US 12,144,185 B2
(45) Date of Patent: Nov. 12, 2024

(54) METHOD OF MAKING OVONIC THRESHOLD SWITCH SELECTORS USING MICROWAVE ANNEALING

(71) Applicants: WESTERN DIGITAL TECHNOLOGIES, INC., San Jose, CA (US); POHANG UNIVERSITY OF SCIENCE AND TECHNOLOGY, Pohang (KR)

(72) Inventors: Oleksandr Mosendz, Campbell, CA (US); Hyunsang Hwang, Pohang (KR); Jangseop Lee, Pohang (KR); Raghuveer S. Makala, Campbell, CA (US)

(73) Assignees: Sandisk Technologies, Inc., Milpitas, CA (US); POHANG UNIVERSITY OF SCIENCE AND TECHNOLOGY, Pohang (KR)

( * ) Notice: Subject to any disclaimer, the term of this patent is extended or adjusted under 35 U.S.C. 154(b) by 443 days.

(21) Appl. No.: 17/591,200

(22) Filed: Feb. 2, 2022

(65) Prior Publication Data
US 2023/0247843 A1    Aug. 3, 2023

(51) Int. Cl.
*H10B 63/00* (2023.01)
*H10N 70/00* (2023.01)
*H10N 70/20* (2023.01)

(52) U.S. Cl.
CPC ......... *H10B 63/24* (2023.02); *H10N 70/231* (2023.02); *H10N 70/823* (2023.02)

(58) Field of Classification Search
CPC ...................................................... H10B 63/24
See application file for complete search history.

(56) References Cited

U.S. PATENT DOCUMENTS

| | | |
|---|---|---|
| 5,670,224 A | 9/1997 | Izu et al. |
| 6,028,393 A | 2/2000 | Izu et al. |
| 10,199,434 B1 | 2/2019 | Lee et al. |
| 10,249,683 B1 | 4/2019 | Lille et al. |
| 10,354,710 B2 | 4/2019 | Petti et al. |
| 10,381,409 B1 | 8/2019 | Zhou et al. |
| 10,381,411 B2 | 8/2019 | Lille |
| 10,381,559 B1 | 8/2019 | Zhou et al. |
| 10,580,976 B2 | 3/2020 | Takahashi et al. |
| 11,031,435 B2 | 6/2021 | Grobis et al. |
| 11,088,170 B2 | 8/2021 | Zhang et al. |
| 2008/0274584 A1 | 11/2008 | Chen et al. |
| 2012/0051123 A1 | 3/2012 | Liu |
| 2013/0075844 A1 | 3/2013 | Miyano et al. |
| 2017/0244031 A1 | 8/2017 | Jeong et al. |
| 2019/0027201 A1 | 1/2019 | Petti et al. |

(Continued)

OTHER PUBLICATIONS

International Search Report and Written Opinion of the International Searching Authority for International Patent Application No. PCT/US2022/030577, mailed Oct. 3, 2022, 10 pages.

(Continued)

*Primary Examiner* — Peter M Albrecht
(74) *Attorney, Agent, or Firm* — THE MARBURY LAW GROUP PLLC

(57) ABSTRACT

A method includes forming a first electrode layer over a substrate, forming an ovonic threshold switch (OTS) material layer over the first electrode layer, microwave annealing the OTS material layer, and forming a second electrode layer over the OTS material layer.

20 Claims, 32 Drawing Sheets

(56) References Cited

U.S. PATENT DOCUMENTS

| | | |
|---|---|---|
| 2019/0189688 A1 | 6/2019 | Lille |
| 2019/0288192 A1 | 9/2019 | Takahashi et al. |
| 2019/0355902 A1 | 11/2019 | Chan et al. |
| 2019/0362785 A1 | 11/2019 | Hu et al. |
| 2020/0020542 A1 | 1/2020 | Lee et al. |
| 2020/0066987 A1 | 2/2020 | Sims et al. |
| 2020/0350364 A1 | 11/2020 | Wan et al. |
| 2020/0388752 A1 | 12/2020 | Bai et al. |
| 2020/0395410 A1 | 12/2020 | Grobis et al. |
| 2021/0151506 A1 | 5/2021 | Kim et al. |
| 2021/0159248 A1 | 5/2021 | Zhang et al. |
| 2021/0167285 A1 | 6/2021 | Horii et al. |
| 2021/0210497 A1 | 7/2021 | Yang et al. |
| 2021/0408019 A1 | 12/2021 | Makala et al. |
| 2021/0408020 A1 | 12/2021 | Makala et al. |
| 2021/0408114 A1 | 12/2021 | Lille et al. |

OTHER PUBLICATIONS

Cheng, H.Y. et al., "An ultra high endurance and thermally stable selector based on TeAsGeSiSe chalcogenides compatible with BEOL IC Integration for cross-point PCM," 2017 IEEE International Electron Devices Meeting (IEDM), San Francisco, CA, USA, 2017, pp. 2.2.1-2.2.4, doi: 10.1109/IEDM.2017.8268310.

Elliott, S.R., "Medium-range structural order in covalent amorphous solids," Nature, vol. 354, pp. 445-452 (1991) https://doi.org/10.1038/354445a0.

Fu, C. et al., "Understanding the microwave annealing of silicon," AIP Advances, vol. 7, pp. 035214 (2017) https://doi.org/10.1063/1.4978912.

Gilmer, D. C. et al., "Effects of RRAM Stack Configuration on Forming Voltage and Current Overshoot," 2011 3rd IEEE International Memory Workshop (IMW), Monterey, CA, USA, 2011, pp. 1-4, doi: 10.1109/IMW.2011.5873225.

Hatem, F. et al., "Endurance improvement of more than five orders in GexSe1-x OTS selectors by using a novel refreshing program scheme," 2019 IEEE International Electron Devices Meeting (IEDM), San Francisco, CA, USA, 2019, pp. 35.2.1-35.2.4, doi: 10.1109/IEDM19573.2019.8993448.

Karpov, V.G. et al., "Field-induced nucleation in phase change memory," Physical Review B, vol. 78, pp. 052201, (2008); DOI: 10.1103/PhysRevB.78.052201.

Kim, T. et al., "Firing voltage reduction in thermally annealed Ge—As—Te thin film with ovonic threshold switching," Journal of Vacuum Science & Technology B, vol. 38, No. 3, pp. 032213 (2020); https://doi.org/10.1116/1.5144736.

Laguna, C. et al., "Multilayer OTS Selectors Engineering for High Temperature Stability, Scalability and High Endurance," 2021 IEEE International Memory Workshop (IMW), Dresden, Germany, 2021, pp. 1-4, doi: 10.1109/IMW51353.2021.9439590.

Laudato, M. et al., "ALD GeAsSeTe Ovonic Threshold Switch for 3D Stackable Crosspoint Memory," 2020 IEEE International Memory Workshop (IMW), Dresden, Germany, 2020, pp. 1-4, doi: 10.1109/IMW48823.2020.9108152.

Lee, J. et al., "Enhanced Switching Characteristics of an Ovonic Threshold Switching Device With an Ultra-Thin MgO Interfacial Layer," in IEEE Electron Device Letters, vol. 43, No. 2, pp. 220-223, Feb. 2022, doi: 10.1109/LED.2021.3138095.

Lee, S. et al., "Mg—Te OTS selector with Low Ioff ( <100 pA), Fast Switching Speed ($\tau d=7$ ns), and High Thermal Stability (400° C. / 30min) for X-point Memory Applications," 2021 Symposium on VLSI Technology, Kyoto, Japan, 2021, pp. 1-2.

Lelmini, D. et al., "Physical interpretation, modeling and impact on phase change memory (PCM) reliability of resistance drift due to chalcogenide structural relaxation," 2007 IEEE International Electron Devices Meeting, Washington, DC, USA, 2007, pp. 939-942, doi: 10.1109/IEDM.2007.4419107.

Lelmini, D. et al., "Analytical model for subthreshold conduction and threshold switching in chalcogenide-based memory devices," Journal of Applied Physics, vol. 102, pp. 054517 (2007); https://doi.org/10.1063/1.2773688.

Loke, D. et al., "Breaking the Speed Limits of Phase-Change Memory," Science, Jun. 22, 2012, vol. 336, Issue 6088, pp. 1566-1569; DOI: 10.1126/science.1221561.

Lopez, J.M. et al., "Ge—Se—Sb—N-based OTS scaling perspectives for high-density 1 S1R crossbar arrays," 2021 IEEE International Memory Workshop (IMW), Dresden, Germany, 2021, pp. 1-4, doi: 10.1109/IMW51353.2021.9439606.

Naito, M. et al., "Local structure analysis of Ge—Sb—Te phase change materials using high-resolution electron microscopy and nanobeam diffraction," Journal of Applied Physics, vol. 95, pp. 8130-8135 (2004) https://doi.org/10.1063/1.1728316.

Sutorova, K. et al., "Laser desorption ionization time-of-flight mass spectrometry of Ge—As—Te chalcogenides," Rapid Commun Mass Spectrom, Mar. 15, 2015, vol. 29, No. 5, pp. 408-414. doi: 10.1002/rcm.7120.

Teng, L.F. et al., "Effects of microwave annealing on electrical enhancement of amorphous oxide semiconductor thin film transistor," Appl. Phys. Lett., vol. 101, p. 132901 (2012); https://doi.org/10.1063/1.4754627.

Vemuri, R.N.P. et al., "Dopant Activation in Arsenic-Implanted Si by Susceptor-Assisted Low-Temperature Microwave Anneal," in IEEE Electron Device Letters, vol. 32, No. 8, pp. 1122-1124, Aug. 2011, doi: 10.1109/LED.2011.2157453.

Verdy, A. et al., "Carbon electrode for Ge—Se—Sb based OTS selector for ultra low leakage current and outstanding endurance," 2018 IEEE International Reliability Physics Symposium (IRPS), Burlingame, CA, USA, 2018, pp. 6D.4-1-6D.4-6, doi: 10.1109/IRPS.2018.8353635.

Yoo, J. et al., "Te-based binary OTS selectors with excellent selectivity (>105), endurance (>108) and thermal stability (>450° C.)," 2018 IEEE Symposium on VLSI Technology, Honolulu, HI, USA, 2018, pp. 207-208, doi: 10.1109/VLSIT.2018.8510681.

Zalden, P. et al., "Picosecond Electric-Field-Induced Threshold Switching in Phase-Change Materials," Physical Review Letters, vol. 117, No. 6, p. 067601, (2016); DOI:10.1103/PhysRevLett.117.067601.

U.S. Appl. No. 17/075,980, filed Oct. 21, 2020, Western Digital Technologies, Inc.

U.S. Appl. No. 17/579,147, filed Jan. 19, 2022, Western Digital Technologies, Inc.

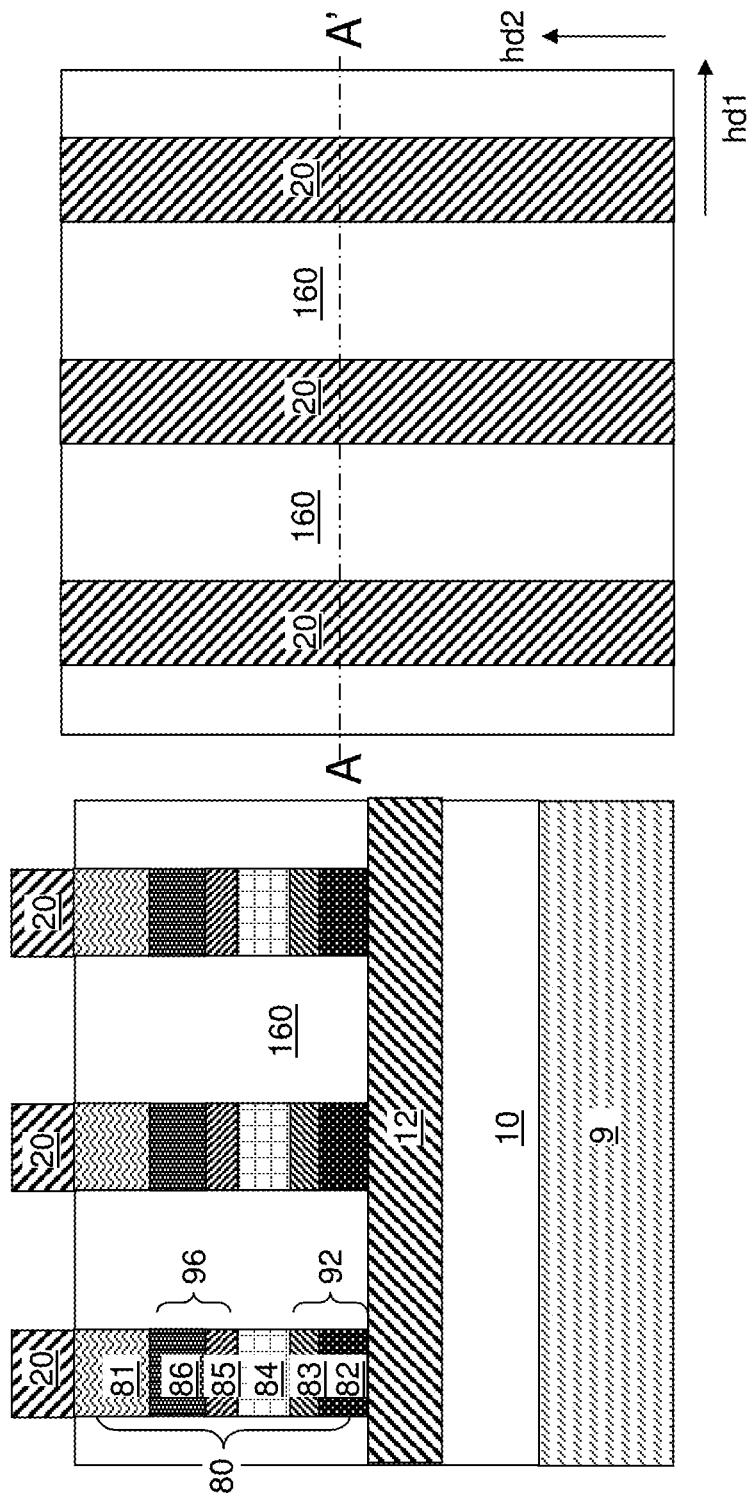

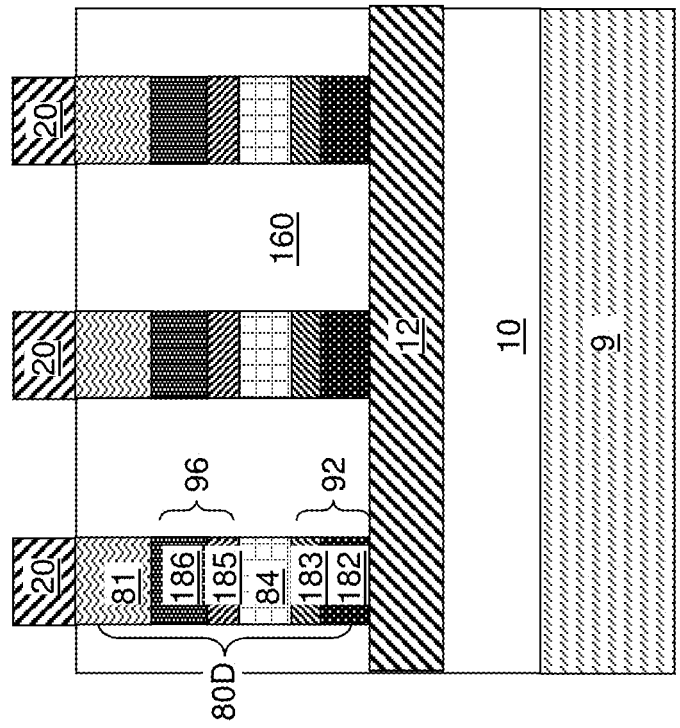
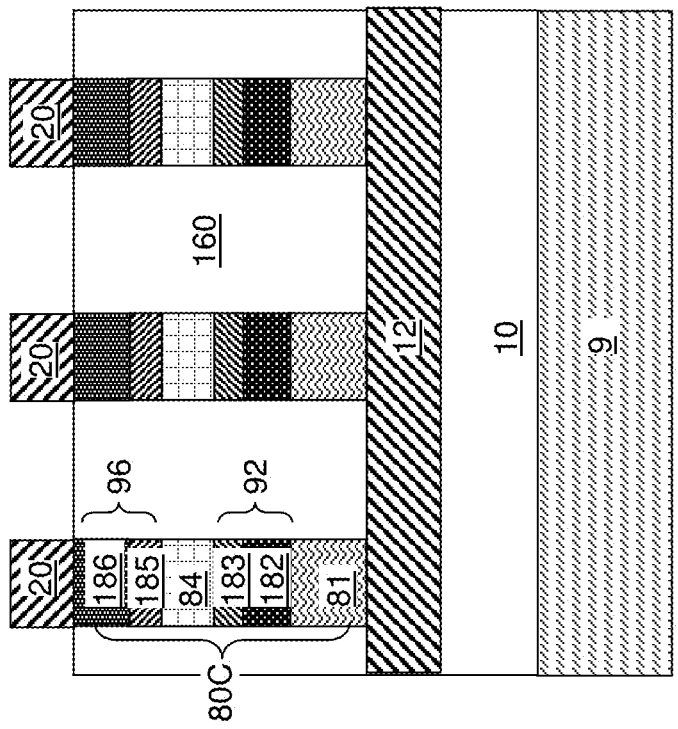

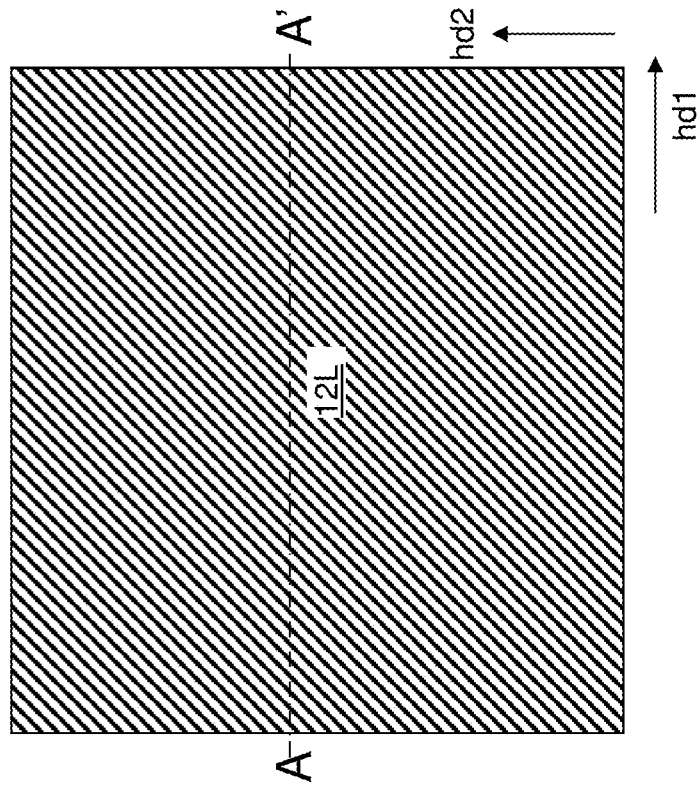
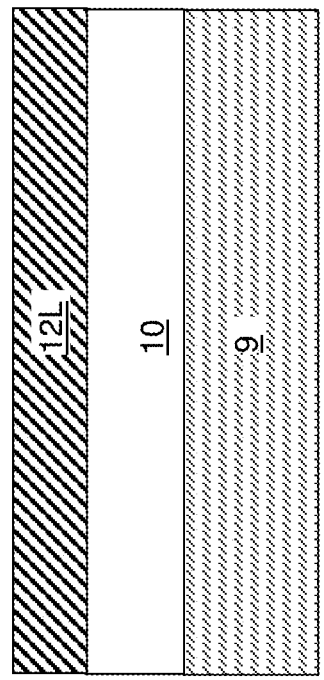
FIG. 11B
FIG. 11A

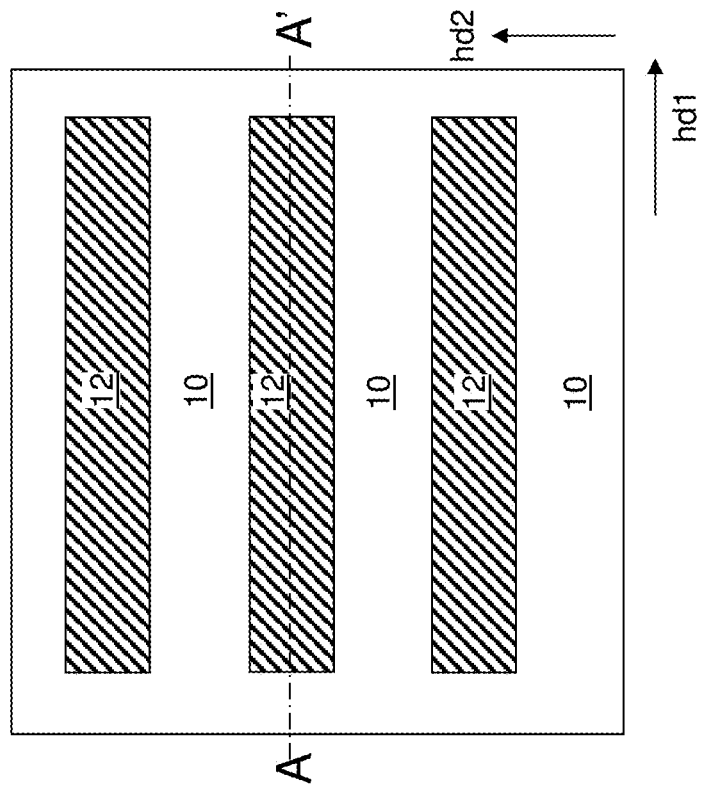
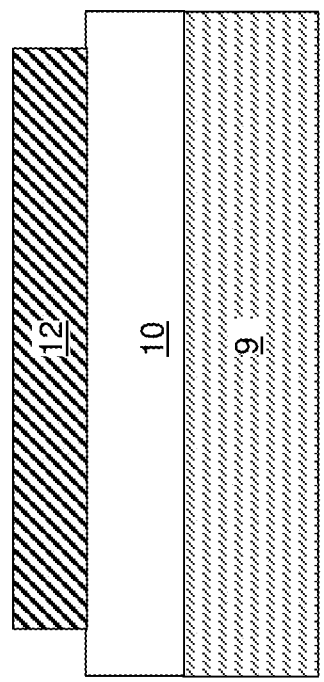
FIG. 12B
FIG. 12A

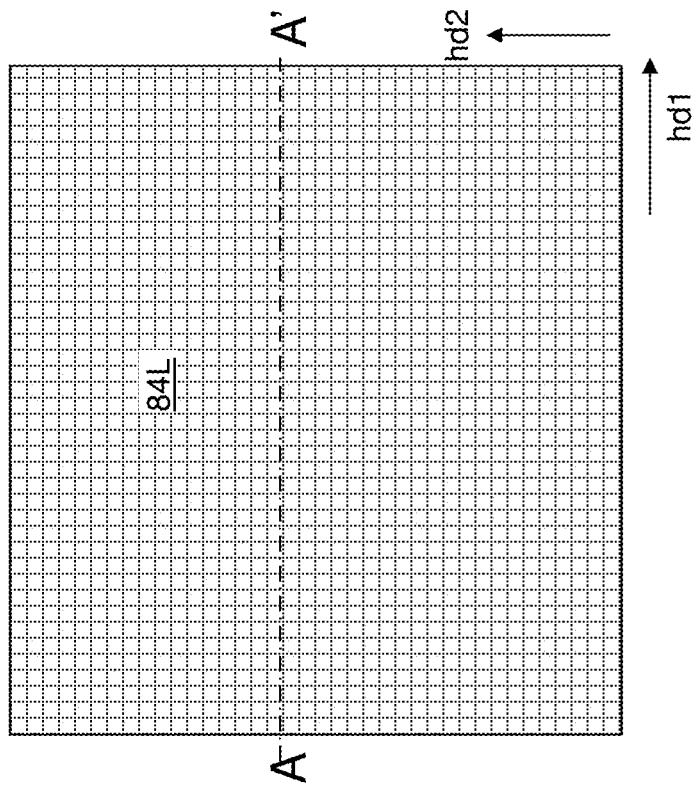
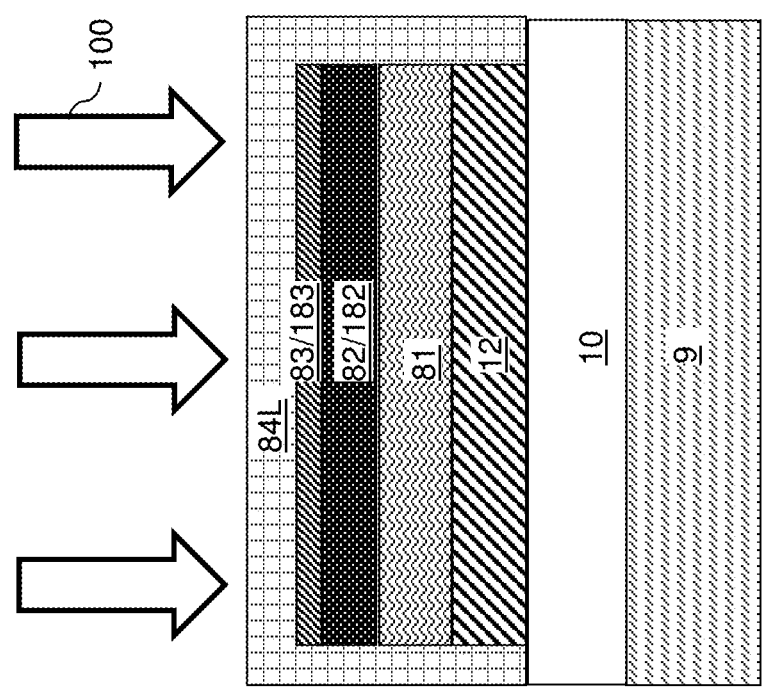
FIG. 14A
FIG. 14B

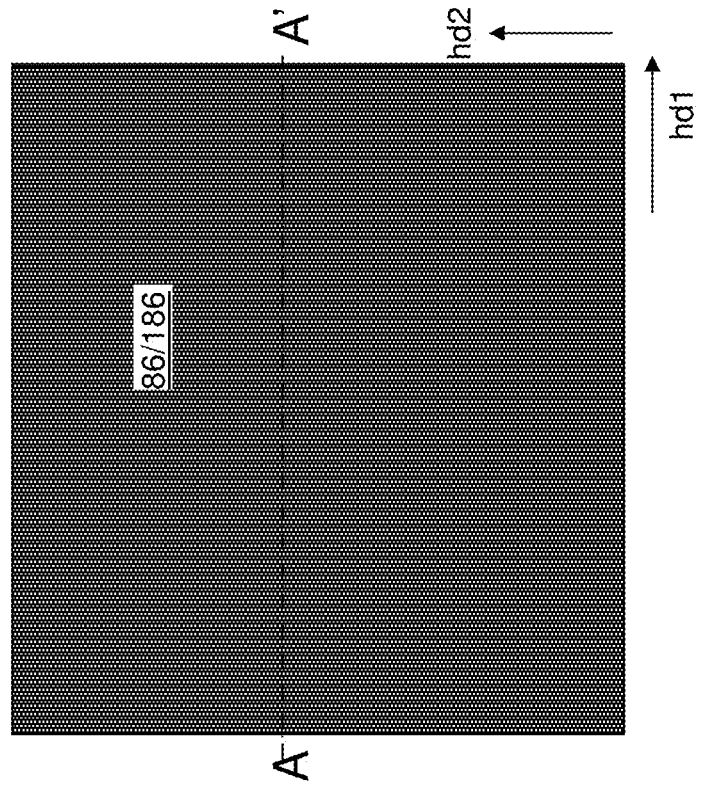
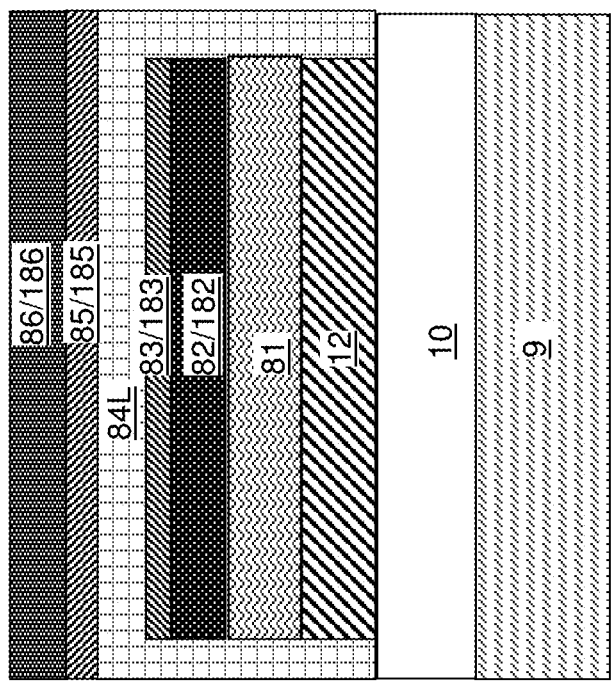
FIG. 15A
FIG. 15B

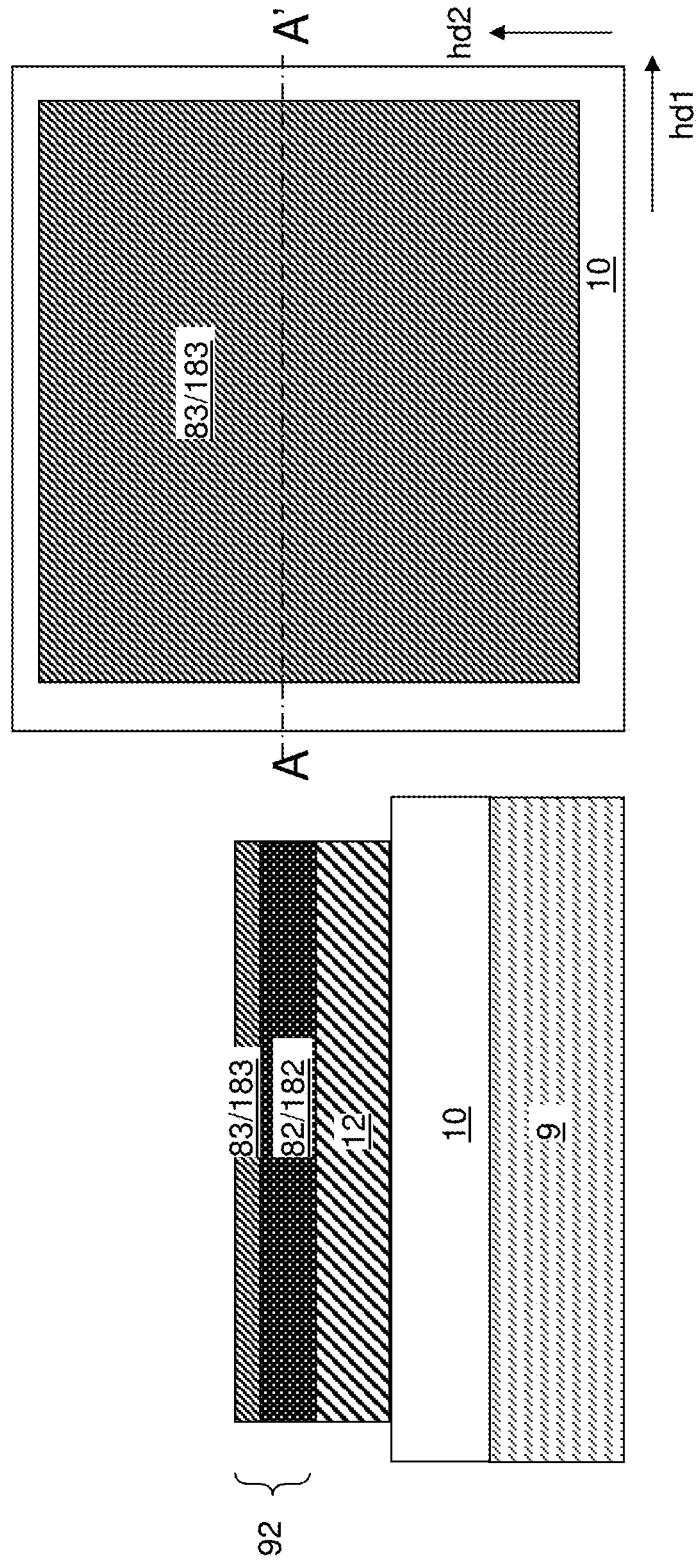

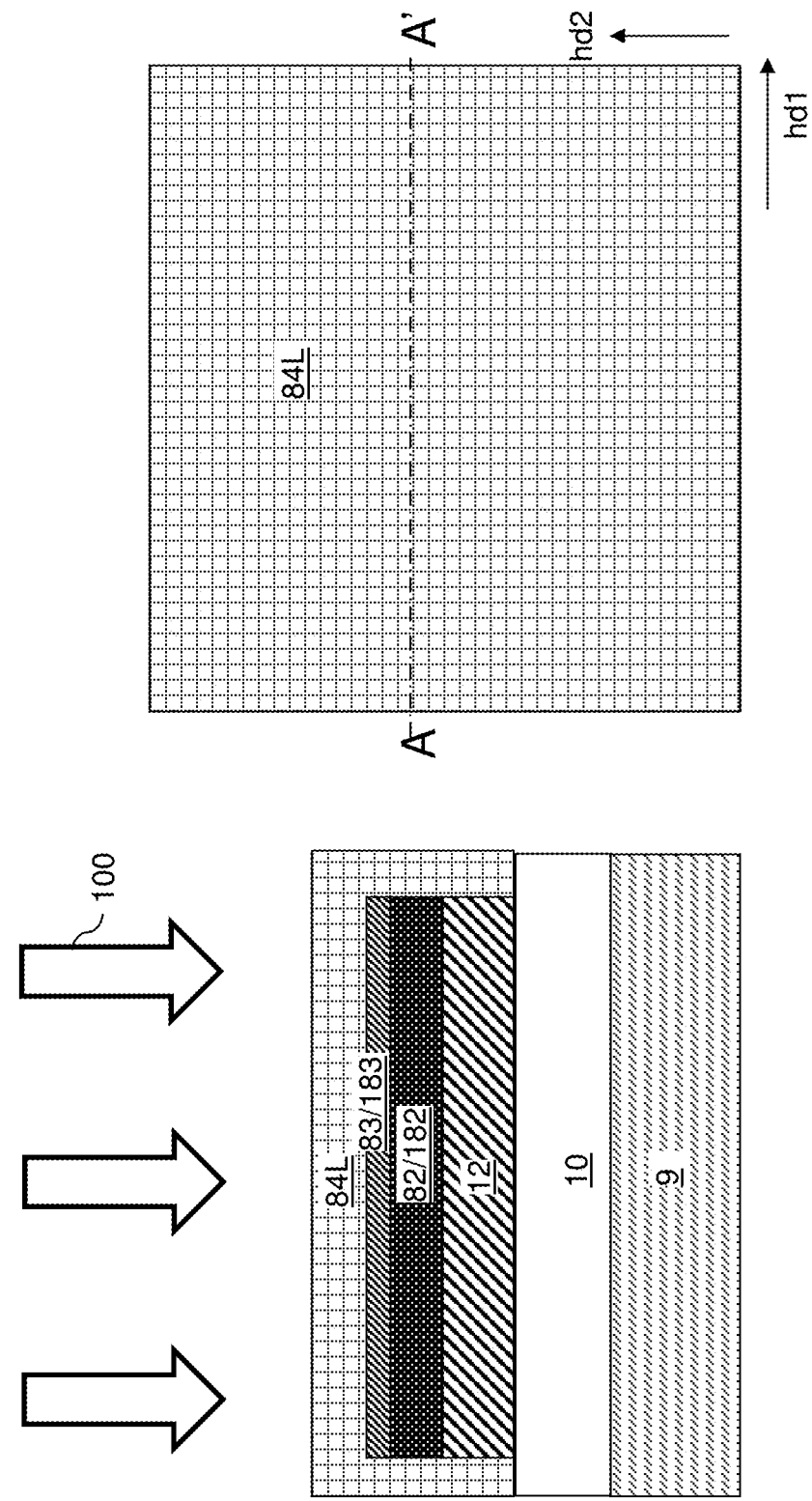

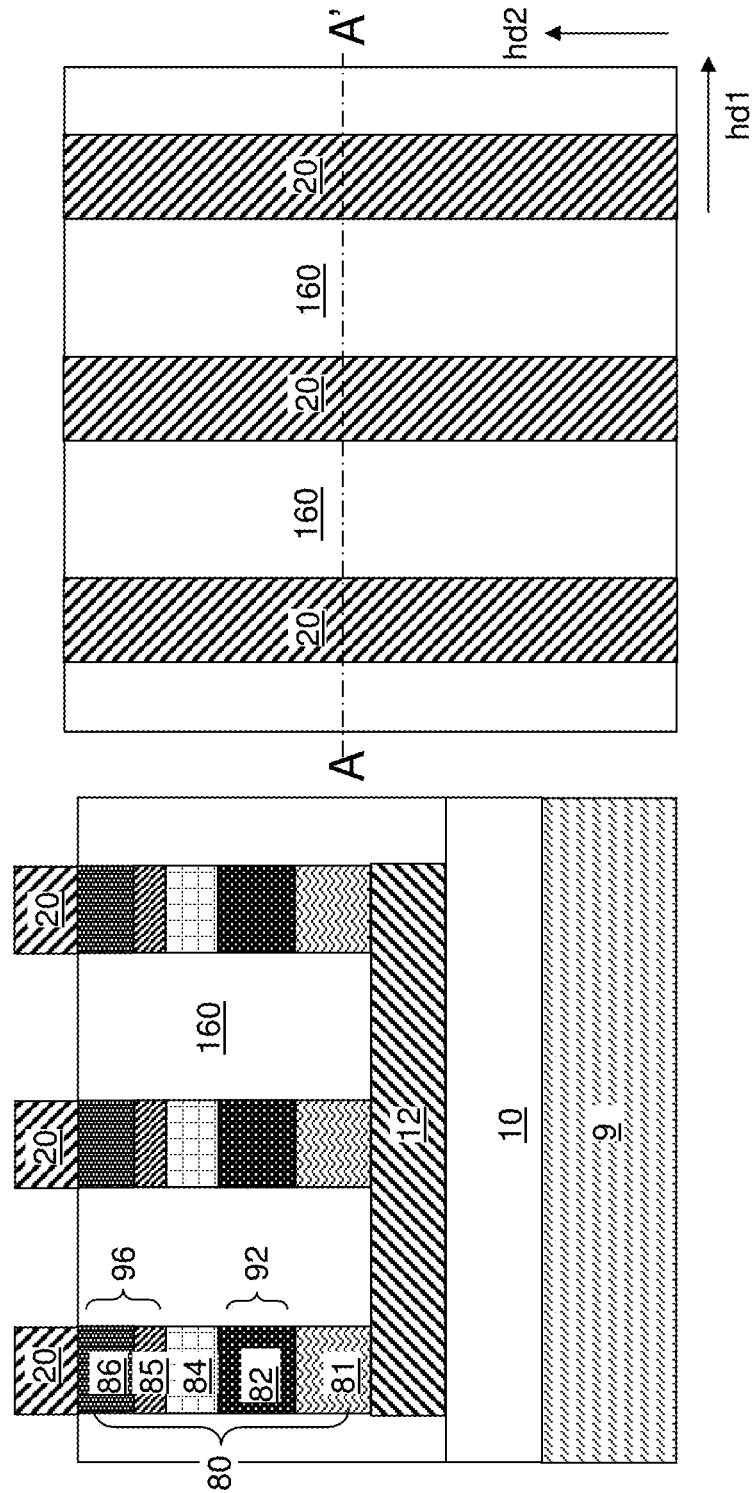

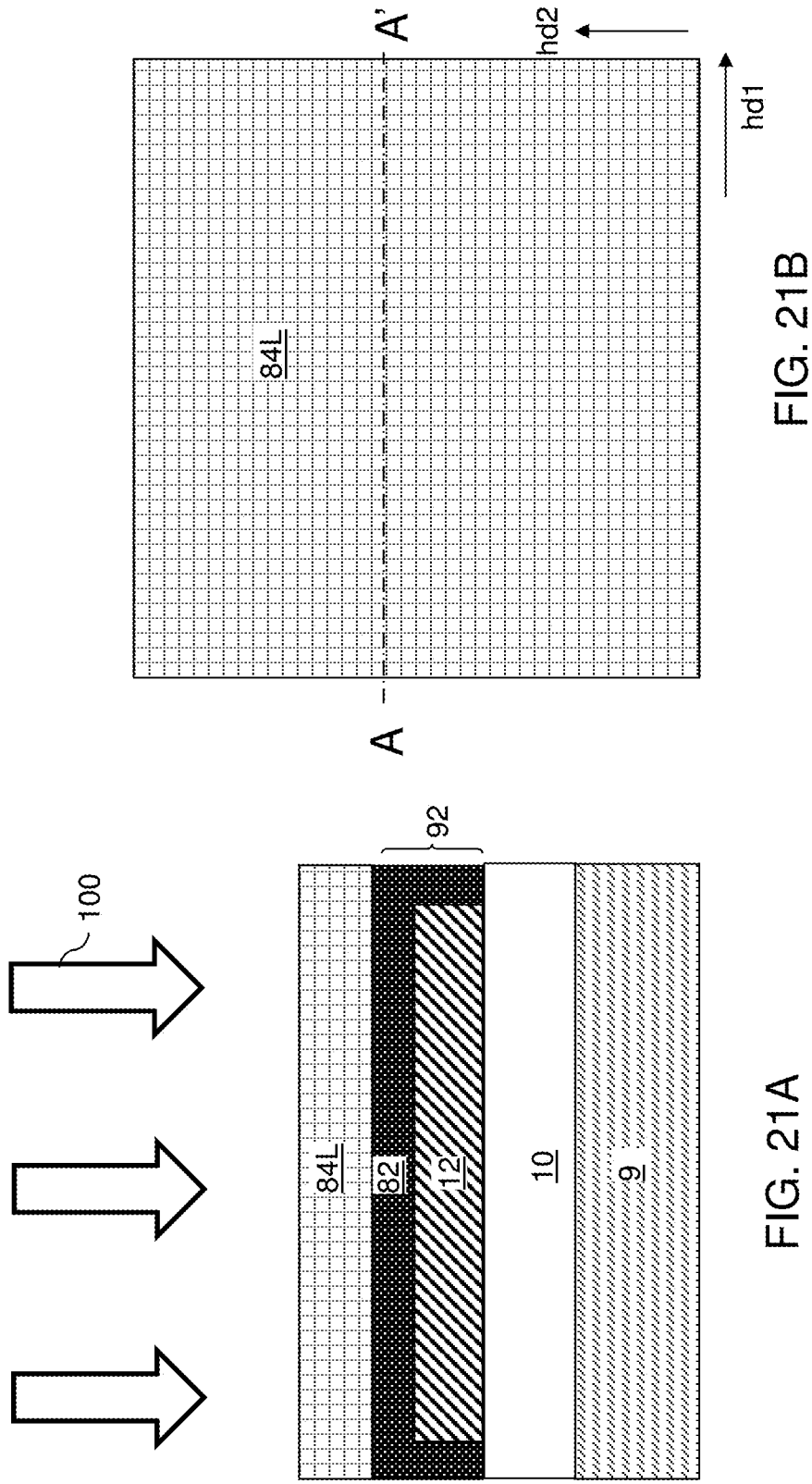

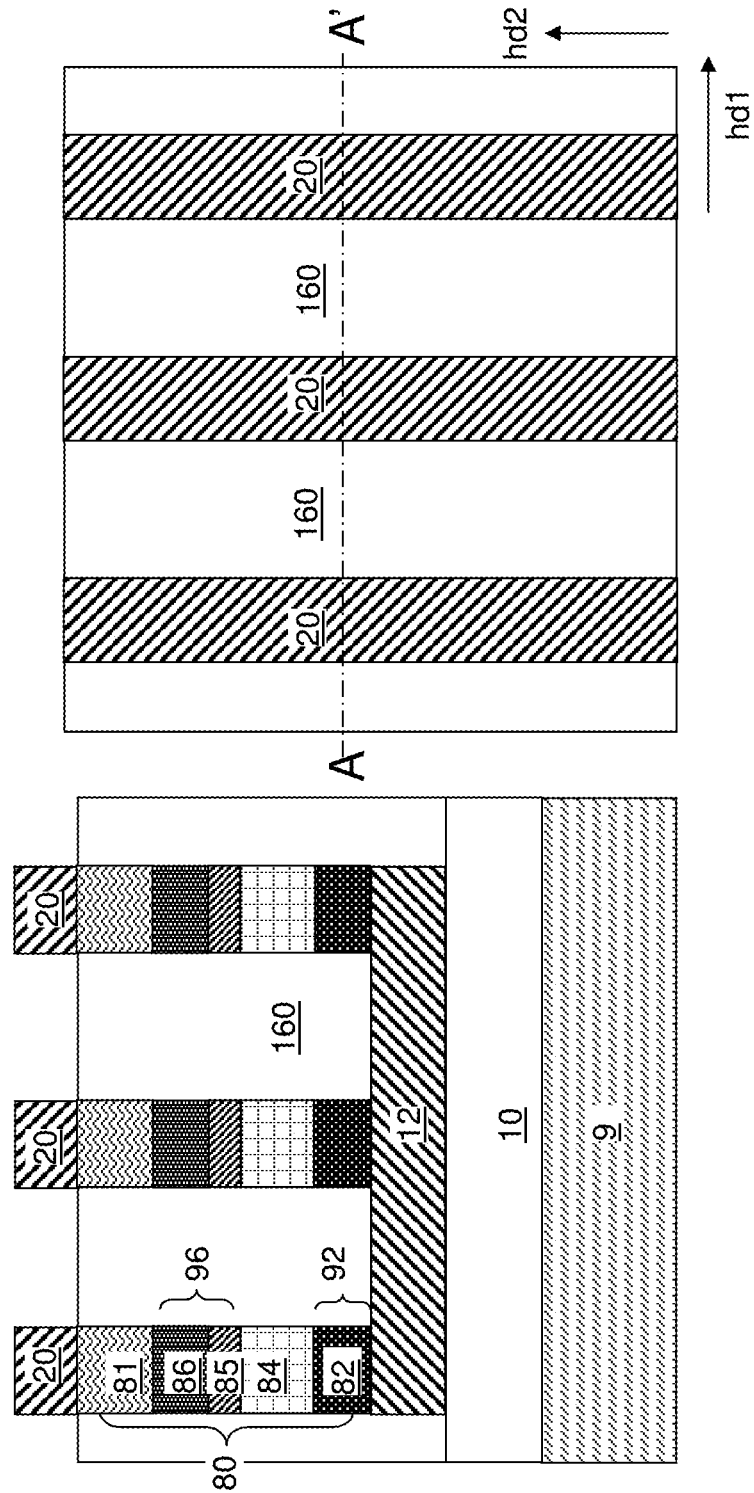

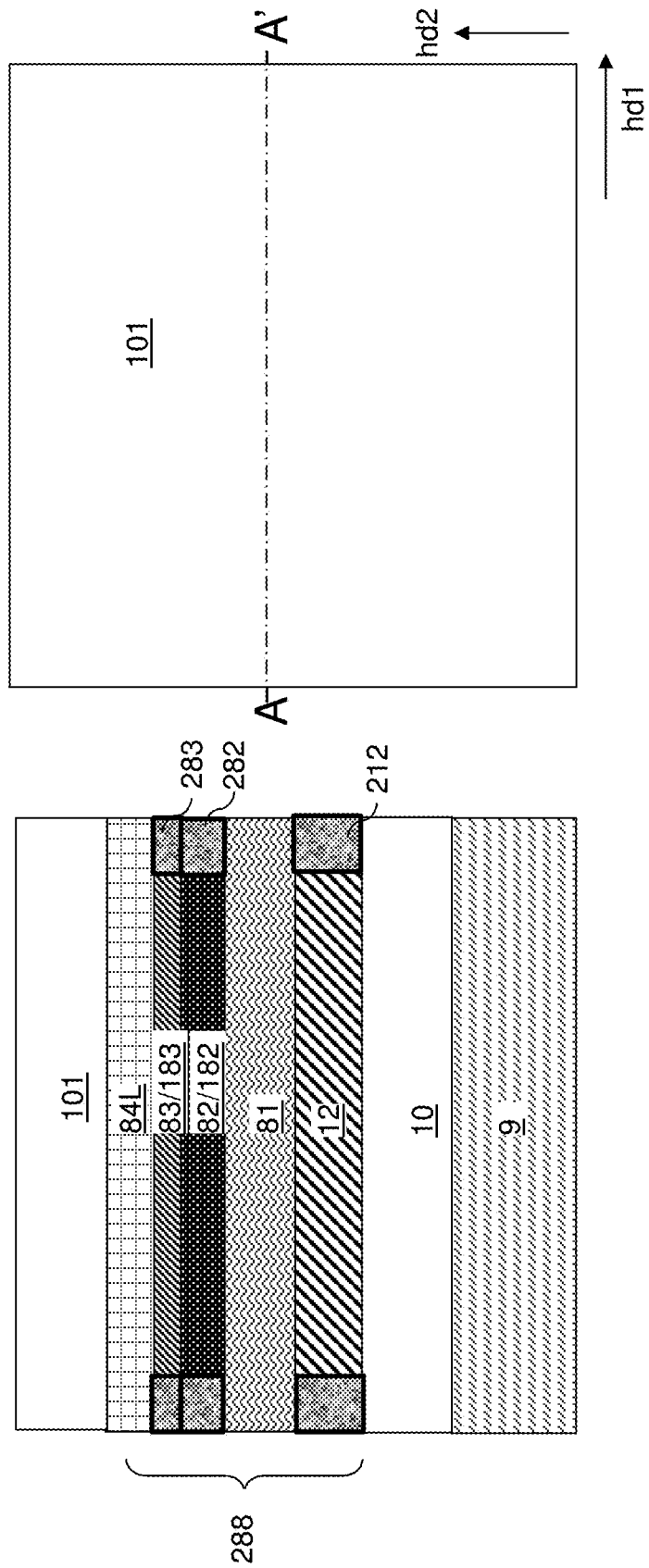

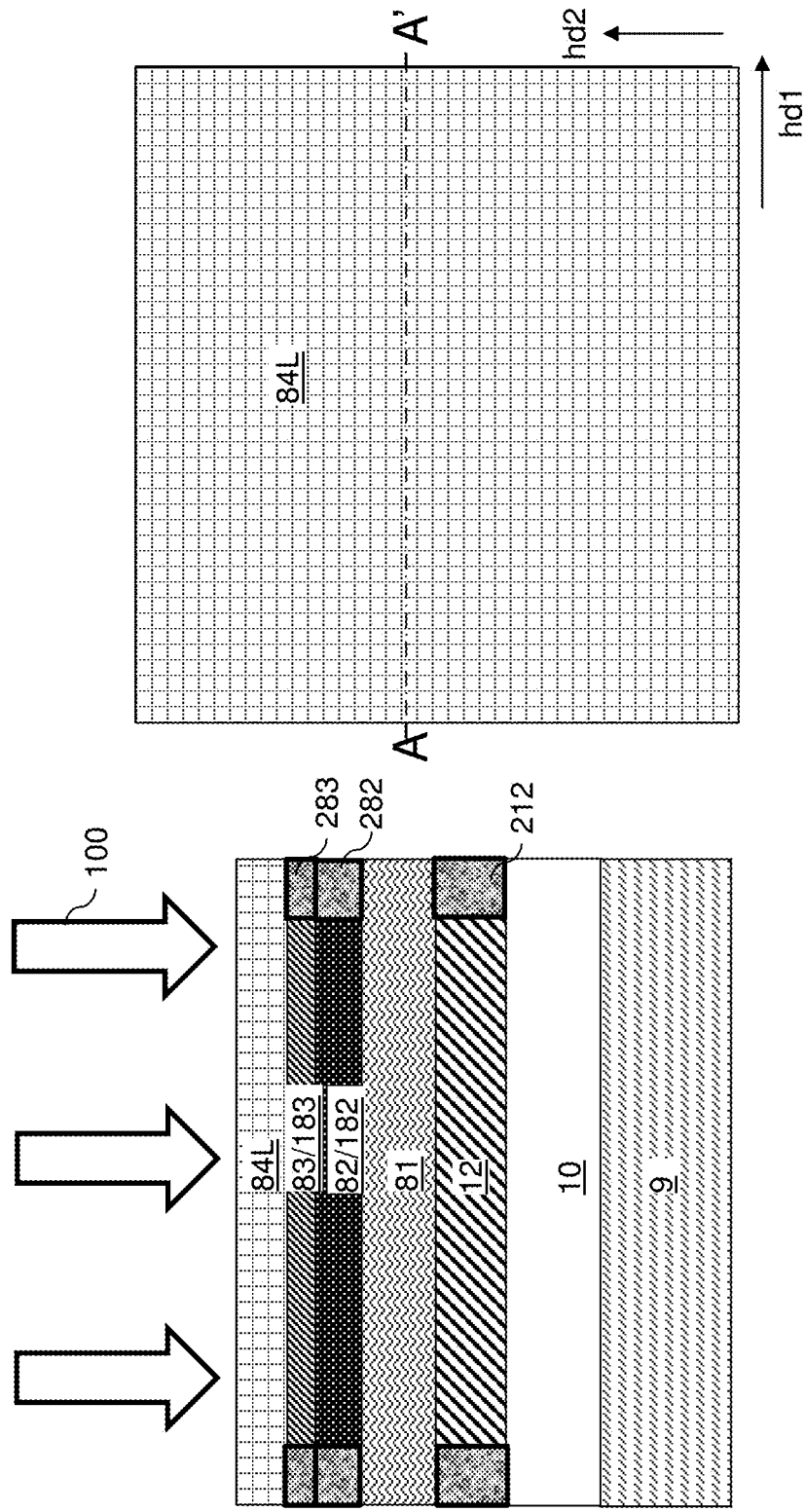

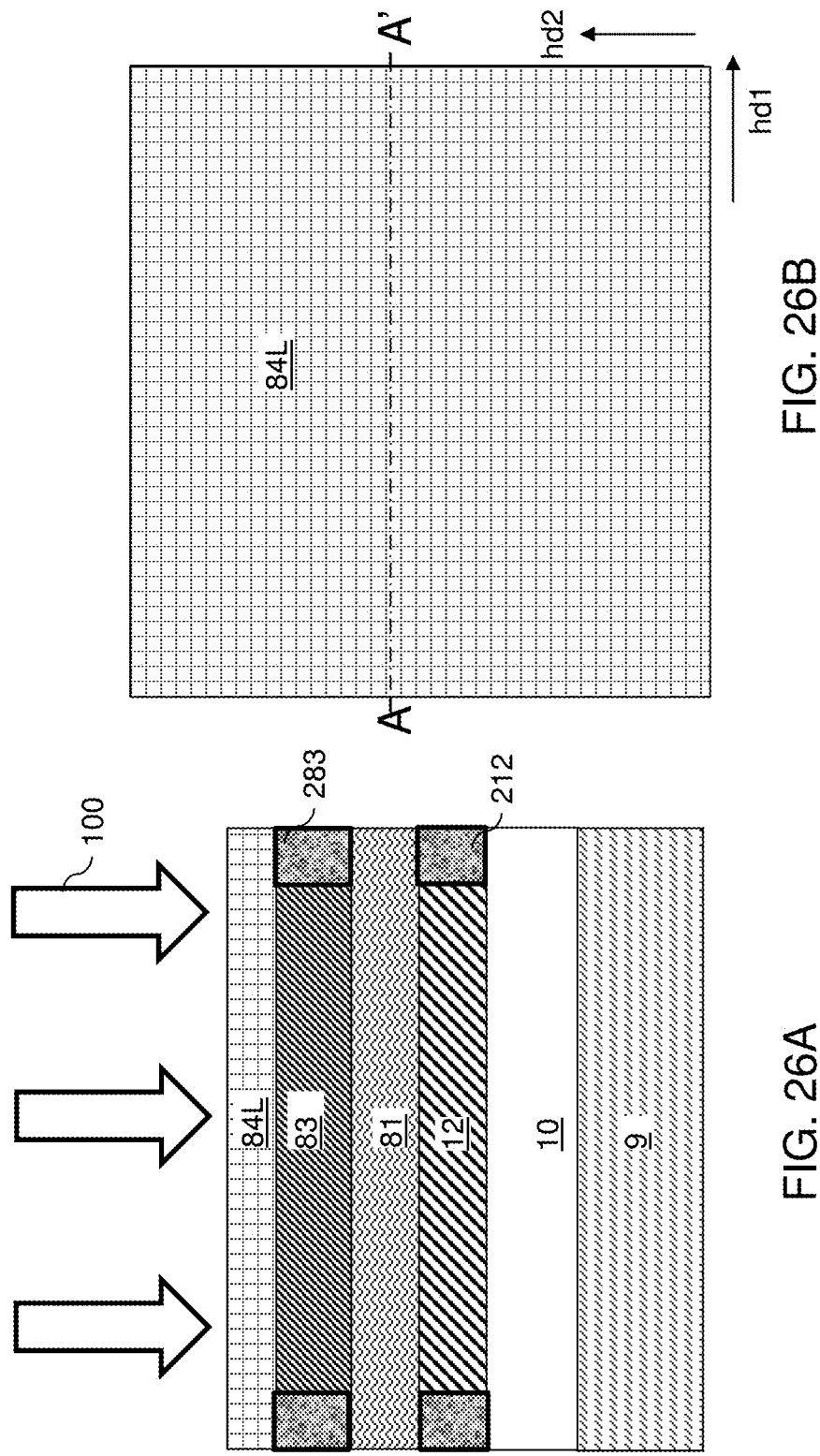

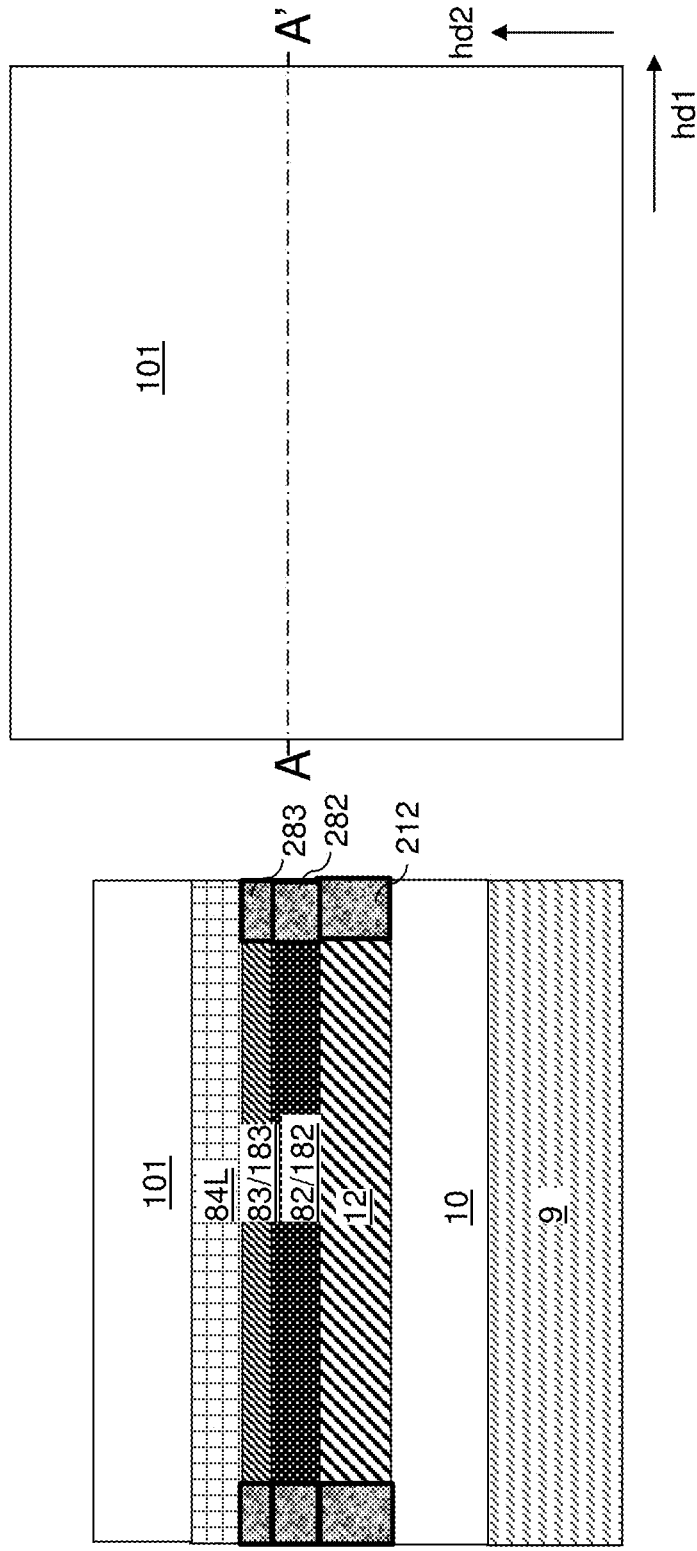

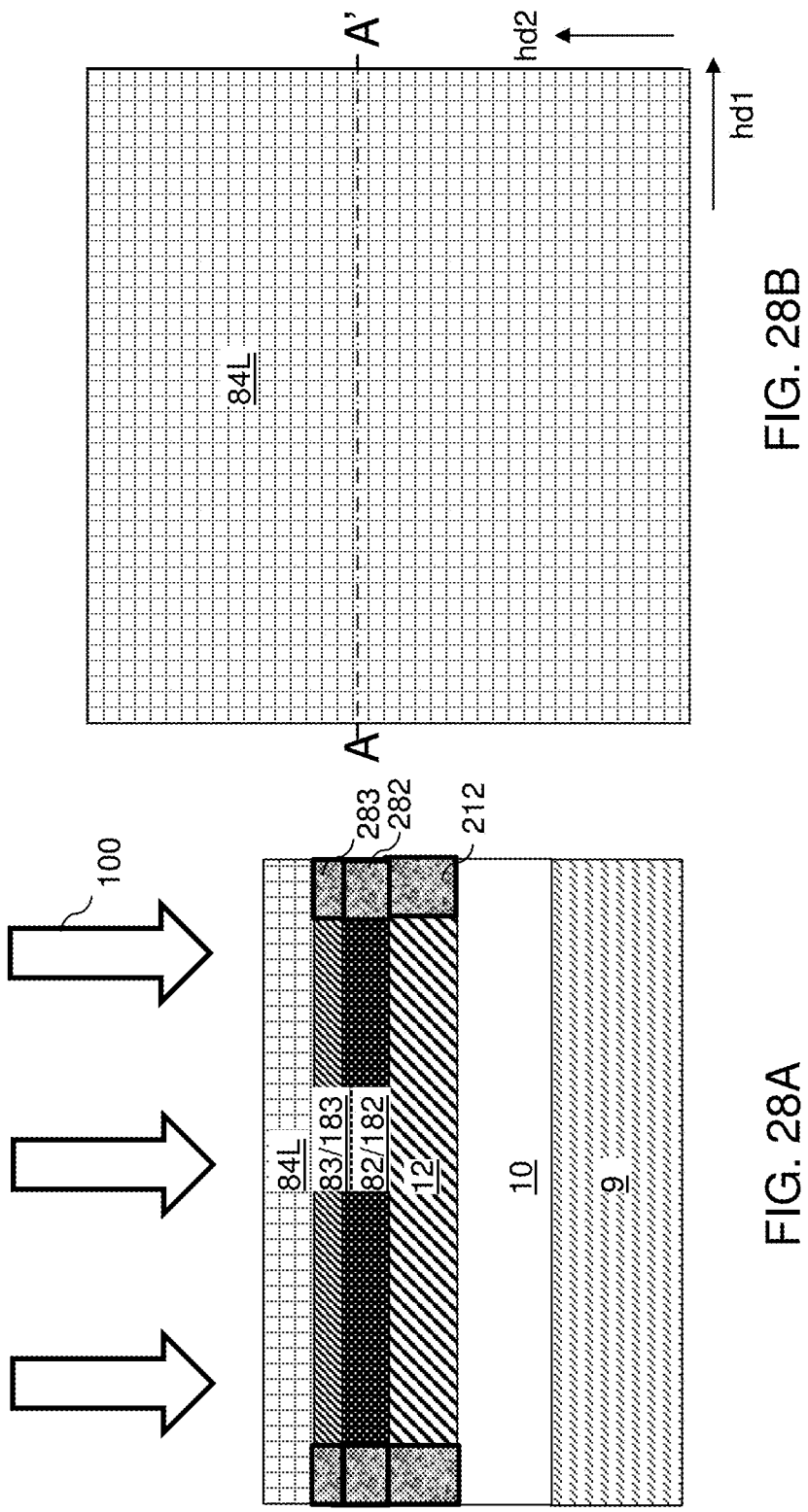

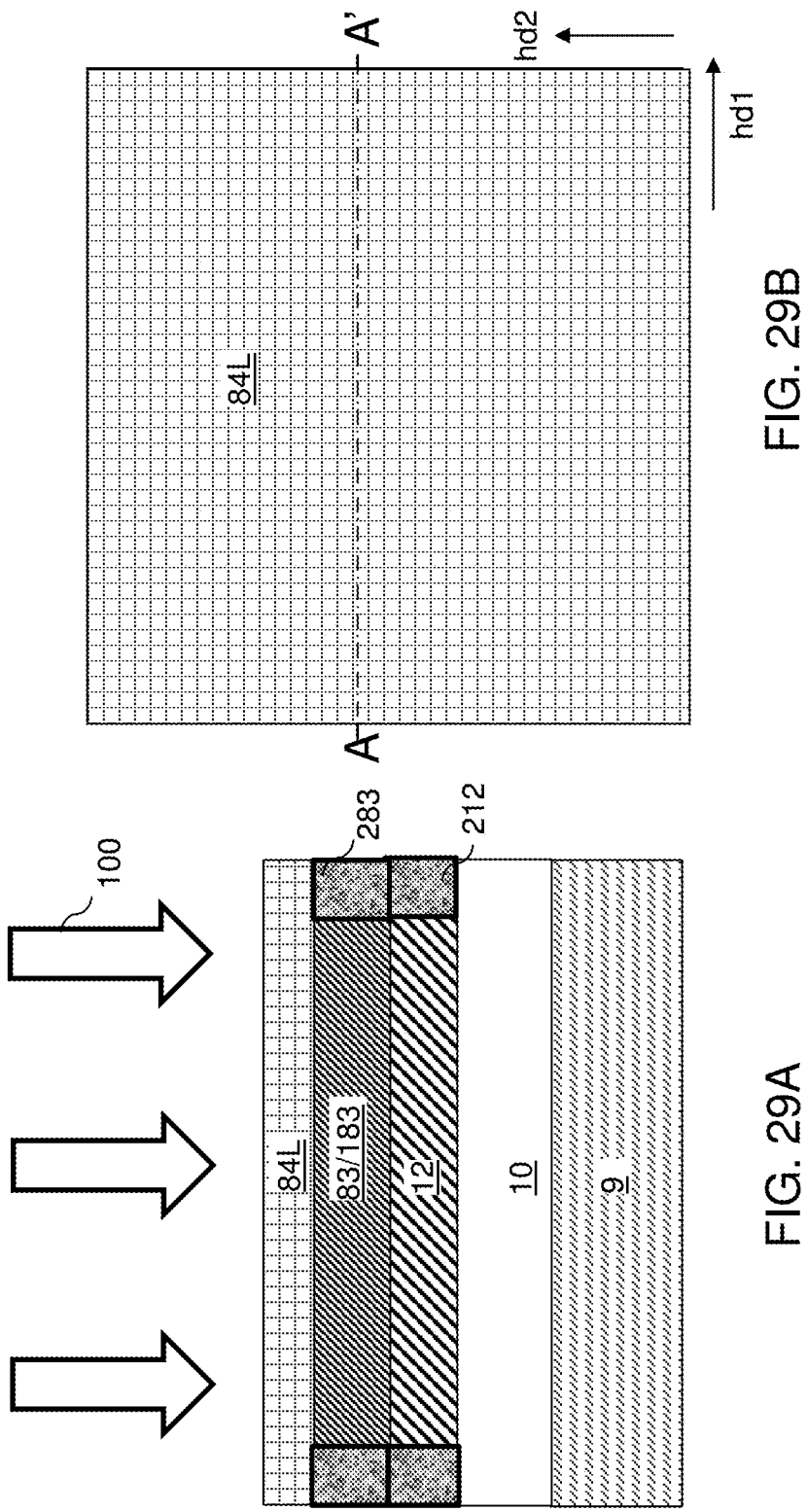

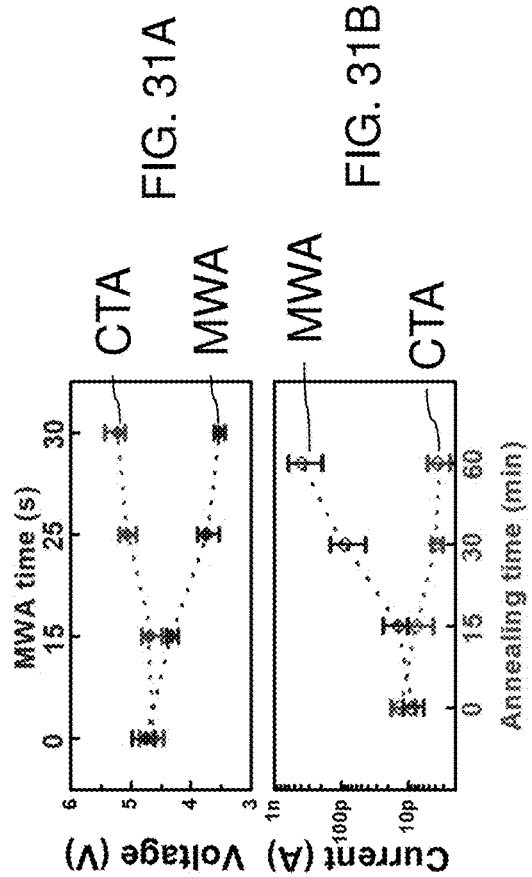
FIG. 31A
FIG. 31B
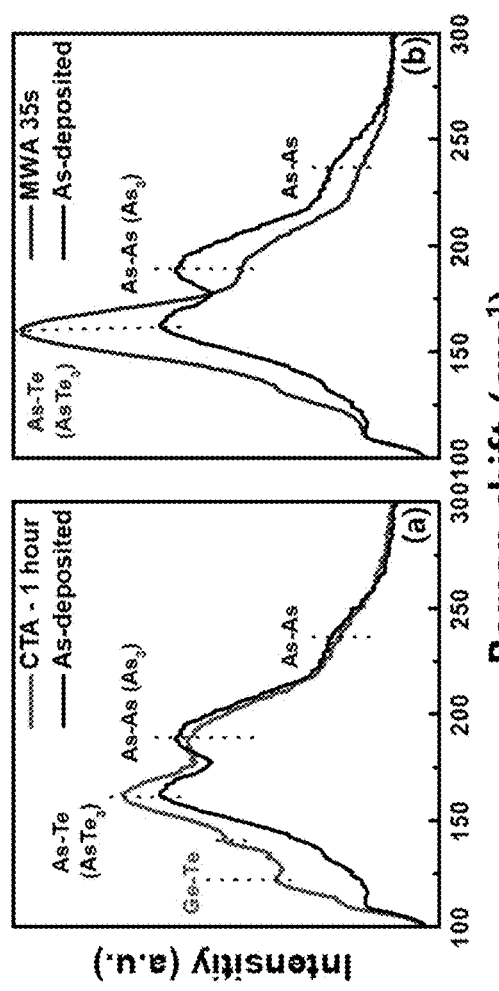
FIG. 32A
FIG. 32B

METHOD OF MAKING OVONIC THRESHOLD SWITCH SELECTORS USING MICROWAVE ANNEALING

FIELD

The present disclosure relates generally to the field of semiconductor devices and specifically to a method of making a memory device including ovonic threshold switch selectors.

BACKGROUND

Various memory devices, such as magnetoresistive random access memory (MRAM) and phase change memory (PCM) devices use selector elements. In one type of a MRAM device, spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the MRAM cell depending if the magnetization of the free layer is parallel or anti-parallel to the magnetization of the polarizer layer, also known as a reference layer.

A phase change memory (PCM) device (also known as a phase change random access memory "PCRAM" or "PRAM") is a type of non-volatile memory device that stores information as a resistivity state of a material that can be in different resistivity states corresponding to different phases of the material. The different phases can include an amorphous state having high resistivity and a crystalline state having low resistivity (i.e., a lower resistivity than in the amorphous state). The transition between the amorphous state and the crystalline state can be induced by controlling the rate of cooling after application of an electrical pulse that renders the phase change material amorphous in a first part of a programming process. The second part of the programming process includes control of the cooling rate of the phase change material. If rapid quenching occurs, the phase change material can cool into an amorphous high resistivity state. If slow cooling occurs, the phase change material can cool into a crystalline low resistivity state.

SUMMARY

According to an aspect of the present disclosure, a method includes forming a first electrode layer over a substrate, forming an ovonic threshold switch (OTS) material layer over the first electrode layer, microwave annealing the OTS material layer, and forming a second electrode layer over the OTS material layer.

BRIEF DESCRIPTION OF THE DRAWINGS

FIG. 6A is a vertical cross-sectional view of an alternative configuration of the exemplary structure after formation of second conductive lines according to the first embodiment of the present disclosure.

FIG. 6B is a top-down view of the alternative configuration of the exemplary structure of FIG. 6A. The vertical plane A-A' is the plane of the vertical cross-sectional view of FIG. 6A.

FIGS. 9A and 9B are vertical cross-sectional view of alternative configurations of a third exemplary structure after formation of second conductive lines according to a third embodiment of the present disclosure.

FIGS. 11A to 29A are vertical cross-sectional views of steps of methods of making various configurations of the exemplary structure using microwave annealing according to the fourth and fifth embodiments of the present disclosure.

FIGS. 11B to 29B are top-down views of the respective exemplary structures of FIGS. 11A to 29A. The vertical plane A-A' is the plane of the vertical cross-sectional view of the respective FIGS. 11A to 29A.

FIGS. 31A and 31B are plots of voltage in volts and current in amps, respectively, versus annealing time according to the non-limiting specific example and according to a comparative example.

FIGS. 32A and 32B are Raman spectroscopy spectra of the non-limiting specific example and of the comparative example respectively.

DETAILED DESCRIPTION

Figure 1A:
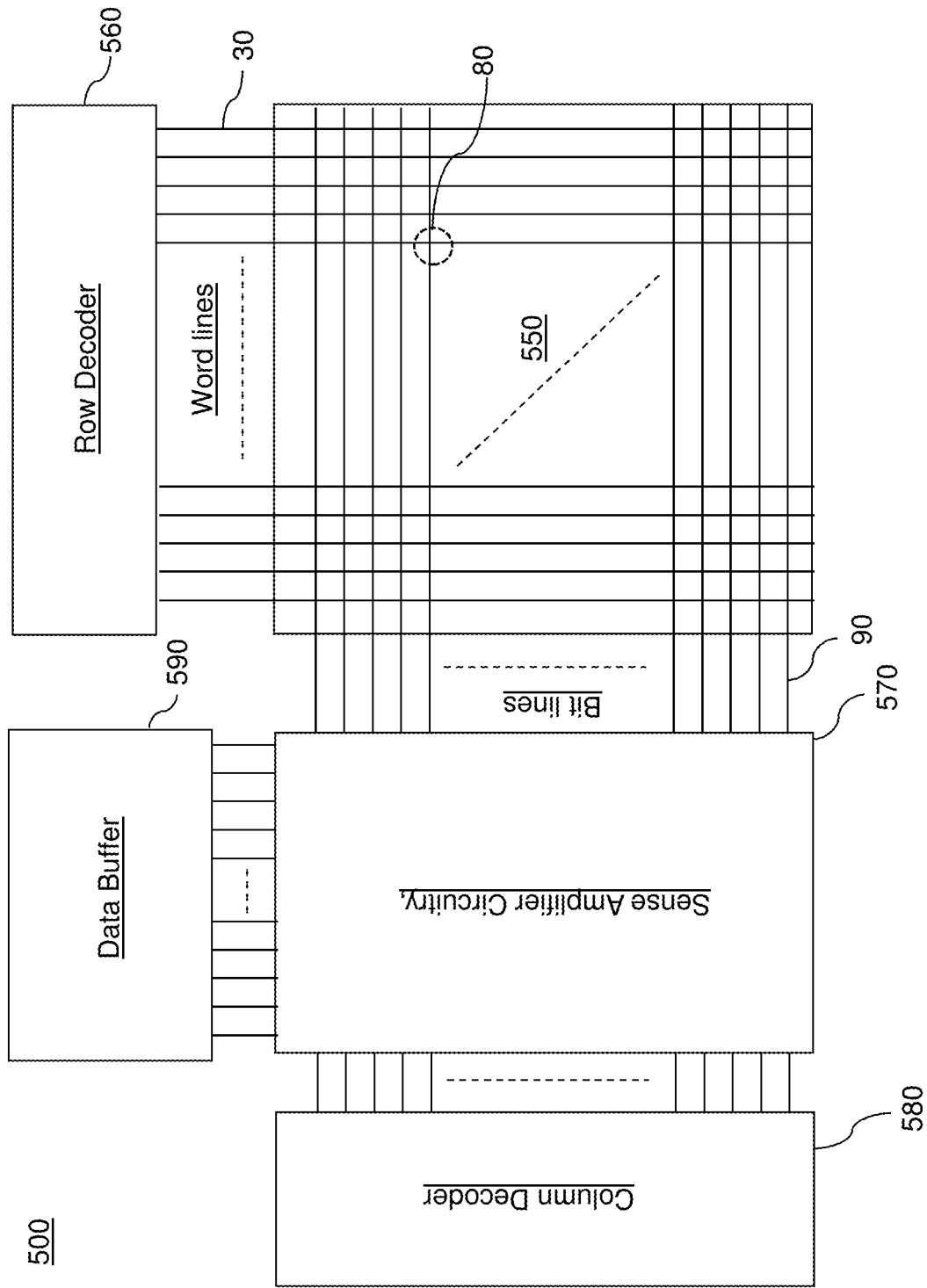
FIG. 1A is an exemplary circuit schematic of a memory device including a two-dimensional or a three-dimensional array of memory elements of one embodiment of the present disclosure.

Embodiments of the present disclosure are directed to a memory device including ovonic threshold switch selector elements and methods of forming the same using microwave annealing, the various aspects of which are described below. The memory devices of various embodiments may be magnetoresistive random access memory (MRAM) devices, phase change memory (PCM) devices or resistive random access memory (ReRAM) devices.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. A same reference numeral refers to a same element or a similar element. Unless otherwise noted, elements with a same reference numeral are presumed to have a same material composition. As used herein, all thermal properties are measured at 300 degrees Kelvin unless otherwise specified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0 \times 10^{-3}$ S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{2}$ S/cm. As used herein, an "insulating material" or a "dielectric material" refers to a material having electrical conductivity much less than $1.0 \times 10^{-3}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{2}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-3}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

FIG. 1A is a schematic diagram of a memory device 500. In one example described below, the memory device is a MRAM device. However, ReRAM and/or PCM devices may be used instead. The memory device 500 includes memory cells which may be located in memory pillar structures 80 in an array configuration. In one embodiment, each memory cell may comprise the STT memory cell of the MRAM device. The memory device can be configured as a random access memory device. As used herein, a "random access memory device" refers to a memory device including memory cells that allow random access, i.e., access to any selected memory cell upon a command for reading the contents of the selected memory cell.

The memory device 500 of an embodiment of the present disclosure includes a memory array region 550 containing an array of memory pillar structures 80 located at the intersection of the respective word lines 20 and bit lines 12. The memory device 500 may also contain a row decoder 560 connected to the word lines 20, a programming and sensing circuitry 570 (e.g., a sense amplifier and other bit line control circuitry) connected to the bit lines 12, a column decoder 580 connected to the bit lines 12 and a data buffer 590 connected to the sense circuitry. Multiple instances of the memory pillar structures 80 are provided in an array configuration in the phase change memory device 500.

Figure 1B:
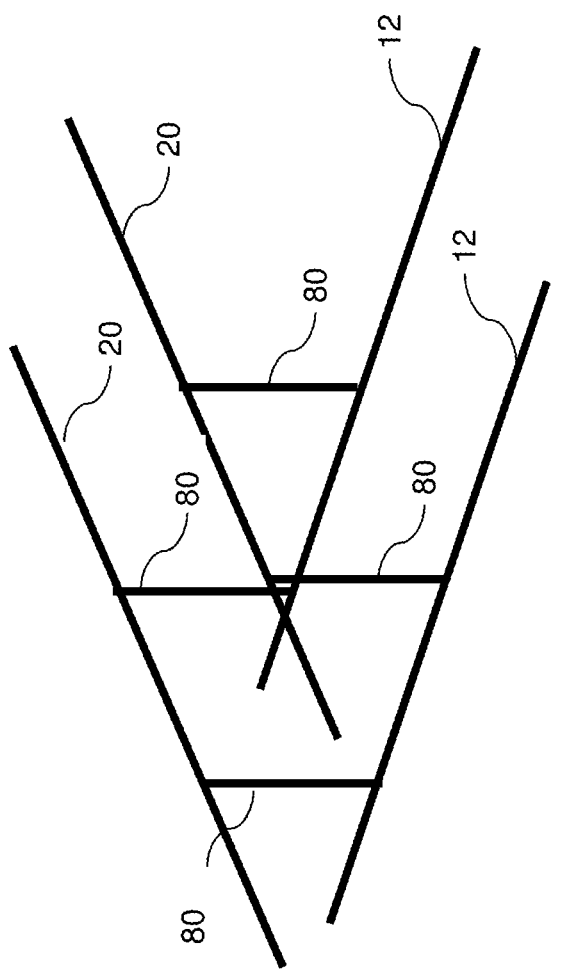
FIG. 1B is a schematic perspective view of a cross-point array of memory elements located between word lines and bit lines in the memory device of FIG. 1A.

FIG. 1B illustrates a cross-point array configuration for a group of memory pillar structures 80. Each memory pillar structure 80 includes a memory material, such as a STT memory cell stack, a phase change material or another material described below, having at least two different resistivity states. The memory material portion is provided between a first electrode, such as a first electrically conductive line 12, and a second electrode, such as a second electrically conductive line 20. A plurality of first electrically conductive lines 12 comprise a first set of parallel metal lines extending along a first horizontal direction (e.g., bit line direction), and a plurality of second electrically conductive lines 20 comprise a second set of parallel metal lines extending along a second horizontal direction (e.g., word line direction). The second horizontal direction may, or may not, be perpendicular to the first horizontal direction. In one embodiment, the first electrically conductive lines 12 may comprise the bit lines, and the second electrically conductive lines 20 may comprise the word lines. Alternatively, the first electrically conductive lines 12 may comprise the word lines, and the second electrically conductive lines 20 may comprise the bit lines.

Figure 2B:
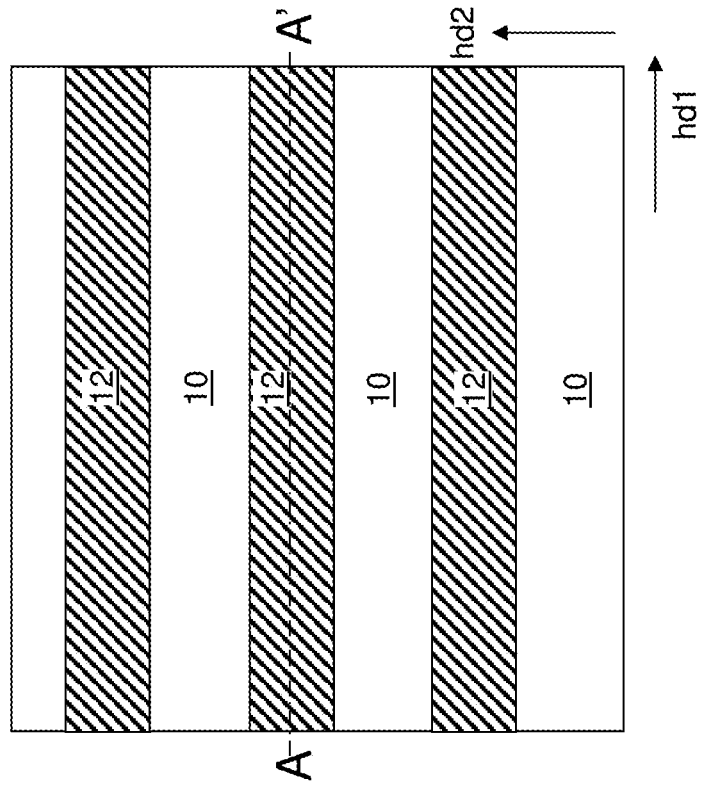
FIG. 2B is a top-down view of the exemplary structure of FIG. 2A. The vertical plane A-A' is the plane of the vertical cross-sectional view of FIG. 2A.
Figure 2A:
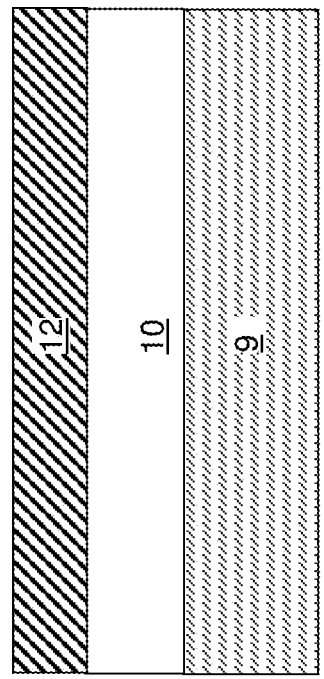
FIG. 2A is a vertical cross-sectional view of an exemplary structure for forming a memory device after formation of first electrically conductive lines according to a first embodiment of the present disclosure.

Referring to FIGS. 2A and 2B, a first exemplary structure for forming a memory device according to the first embodiment is illustrated. An insulating layer 10 can be formed over a top surface of a substrate 9. The substrate 9 can include a semiconductor material, an insulating material, or a conductive material. In one embodiment, the substrate 9 can be a commercially available semiconductor wafer, or a portion of a commercially available semiconductor wafer. In one embodiment, semiconductor devices such as field effect transistors (not shown) may be formed on a top surface of the substrate 9. The insulating layer 10 includes a dielectric material such as silicon oxide, silicon nitride, at least one dielectric metal oxide, or a combination thereof. In one embodiment, metal interconnect structures such as metal lines and metal vias (not shown) may be embedded in the insulating layer 10 to provide electrical connections among the semiconductor devices on the top surface of the substrate 9.

First electrically conductive lines 12 laterally extending along a first horizontal direction hd1 can be formed in an upper portion of the insulating layer 10. The first electrically conductive lines 12 may be formed, for example, by forming line trenches that laterally extend along a first horizontal direction in an upper portion of the insulating layer 10, and by depositing and planarizing at least one conductive material. The at least one conductive material may include a metallic liner material such as TiN, TaN, and/or WN and a metallic fill material such as W, Cu, Co, Mo, Ru, another metal, or an intermetallic ally. Alternatively, at least one conductive material can be deposited over a planar surface of the insulating material layer, and can be patterned to form the first electrically conductive lines 12. In this case, an additional insulating material can be deposited between the first electrically conductive lines 12, and can be subsequently planarized to provide top surfaces that are coplanar with the top surfaces of the first electrically conductive lines 12. The additional insulating material can be incorporated into the insulating layer 10.

In one embodiment, the first electrically conductive lines 12 may be formed as a periodic structure, i.e., as a one-dimensional periodic array of first electrically conductive lines 12. In this case, the first electrically conductive lines 12 can have a first uniform pitch along a second horizontal direction hd2 that is perpendicular to the first horizontal direction hd1. In one embodiment, the first electrically conductive lines 12 may have a same vertical cross-sectional shape within vertical planes that perpendicular to the first horizontal plane hd2. The thickness of each first electrically conductive line 12 can be in a range from 5 nm to 600 nm, such as from 20 nm to 100 nm, although lesser and greater thicknesses can also be employed. The width of each first electrically conductive line 12 can be in a range from 5 nm to 300 nm, such as from 20 nm to 100 nm, although lesser and greater widths can also be employed.

Figures 3A, 3B:
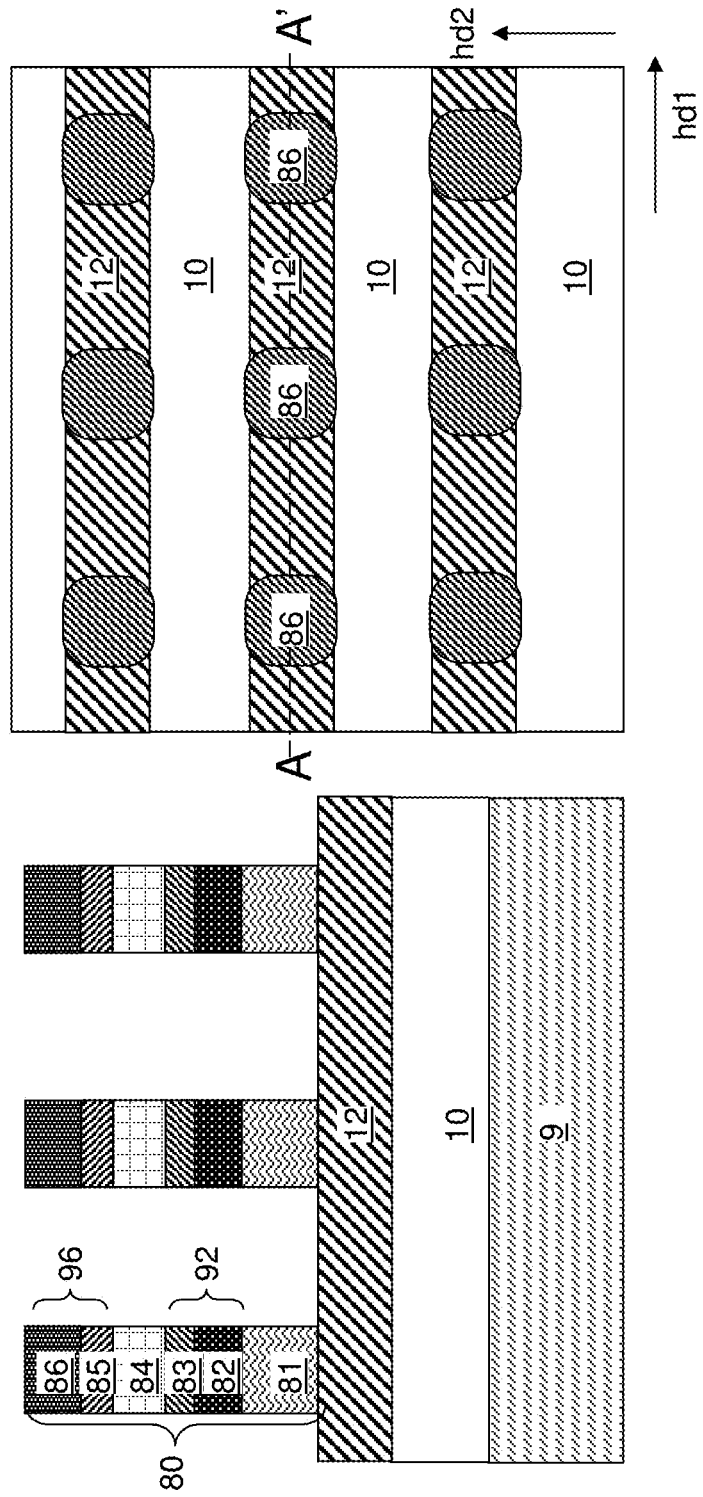
FIG. 3A is a vertical cross-sectional view of the exemplary structure after formation of memory pillar structures according to the first embodiment of the present disclosure.
FIG. 3B is a top-down view of the exemplary structure of FIG. 3A. The vertical plane A-A' is the plane of the vertical cross-sectional view of FIG. 3A.

Referring to FIGS. 3A and 3B, a two-dimensional array of memory pillar structures 80 can be formed on the first electrically conductive lines 12. The two-dimensional array of memory pillar structures can be formed by depositing a material layer stack including at least one memory material layer and switch device layers over the first electrically conductive lines 12 as planar material layers, and by patterning the material layer stack into the two-dimensional array of memory pillar structures 80. The shape and location of each memory pillar structure 80 can be selected such that a row of memory pillar structures 80 is formed on each first electrically conductive line 12. The two-dimensional array of memory pillar structures 80 may be formed as a rectangular periodic array. The horizontal cross-sectional shape of each memory pillar structure 80 may be rectangular, circular, elliptical, or of any generally curvilinear shape having a closed periphery. Patterning of the material layer stack into the two-dimensional array of memory pillar structures 80 can be performed, for example, by applying and patterning a photoresist layer over the material layer stack such that patterned portions of the photoresist layer cover a two-dimensional array, and by performing an anisotropic etch process that transfers the pattern in the photoresist portions through the material layer stack. The etch chemistry of the terminal step of the anisotropic etch process can be selective to the materials of the first electrically conductive lines 12. The photoresist portions can be subsequently removed, for example, by ashing.

Each patterned portion of the at least one memory material layer constitutes a memory element 81, which is a memory cell including a memory material portion. In one embodiment, the at least one memory material layer, and consequently each memory element 81, includes a memory material that provides at least two different resistivity states depending on programming conditions.

In one embodiment, the at least one memory material layer and the memory elements 81 are MRAM elements, such as a tunneling magnetoresistance material (such as a thin magnesium oxide tunneling dielectric layer) located in a magnetic tunnel junction stack between ferromagnetic free and fixed (i.e., reference) layers. The tunneling dielectric located between a ferromagnetic free layer and a ferromagnetic reference layer provides different magnetoresistive tunneling resistance between a parallel spin alignment state and an antiparallel spin alignment state. An exemplary STT MRAM memory element 81 may comprise a memory stack including a reference layer comprising a CoPt/CoFeB superlattice or substack, a MgO tunneling barrier, and a CoFeB free layer. The thickness of the MRAM memory element 81 stack may be suitably selected, and may be in a range from 5 nm to 60 nm, such as from 10 nm to 30 nm, although lesser and greater thicknesses can also be employed. The free layer may be located above or below the reference layer in the memory element 81 stack. The MRAM memory element 81 is capable of supporting two different configurations of the free layer magnetization direction relative to the reference layer magnetization, providing two different resistances for current flowing through the memory stack. The free layer magnetization direction can be switched to the low resistance state in which the free and reference layers are parallel, by flowing electrical current of one polarity between the reference layer and the free layer. The free layer magnetization direction can be switched to the high resistance in which the free and reference layers are anti-parallel, by flowing opposite polarity electrical current of sufficient magnitude between the free layer and the reference layer. The MRAM memory cell resistance is determined by flowing a lower current through the memory cell which does not disturb the resistance state, but provides sufficient signal-to-noise ratio to discern the resistance state.

In another embodiment, the at least one memory material layer and the memory elements 81 can include ReRAM elements. The ReRAM elements may include a transition metal oxide material that provides different resistivity states through oxygen vacancy migration (such as hafnium oxide, tantalum oxide, tungsten oxide), a transition metal oxide material that functions as a reversible thermo-chemical fuse/antifuse (such as nickel oxide), an electrochemical migration-based programmable metallization material, which is also referred to as a conductive bridging or bridge material (such as copper-doped silicon dioxide glass, silver-doped germanium selenide, or silver-doped germanium sulfide), a tunnel barrier material (such as a memristor material, a Schottky barrier material, a barrier metal cell/vacancy-modulated conductive oxide material (such as titanium oxide), or a praseodymium-calcium-manganese oxide (PCMO) material) or a Mott transition-based metal-insulator transition (MIT) switching device material (such as vanadium oxide or niobium oxide). In another embodiment, the memory material layer and the memory elements 81 can include PCM memory elements, such as a phase change memory material (such as a chalcogenide alloy, e.g., a germanium-antimony-telluride compound), or a superlattice structure that exhibits multiple resistive states through interfacial effects (such as a superlattice of chalcogenide alloys).

In another embodiment, the memory elements 81 can include a PCM memory element including a phase change material. As used herein, a "phase change material" refers to a material having at least two different phases providing different resistivity. For example, each memory element 81 may comprise a memory material portion that contains a phase change material providing different electrical resistivities between an amorphous state and a crystalline state. The at least two different phases can be provided, for example, by controlling the time-dependent temperature profile during a cooling step that follows a heated state to provide an amorphous state having a higher resistivity and a polycrystalline state having a lower resistivity. In this case, the higher resistivity state of the phase change material can be achieved by faster quenching of the phase change material after heating the polycrystalline material to an amorphous solid state and/or to a liquid state, and the lower resistivity state of the phase change material can be achieved by heating the amorphous material followed by controlled cooling of the phase change material from the amorphous state to the polycrystalline state. The phase change material acts as the memory material (i.e., data storage material).

Exemplary phase change materials include, but are not limited to, germanium antimony telluride (GST) compounds such as $Ge_2Sb_2Te_5$ or $GeSb_2Te_4$, germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the phase change material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. The thickness of the phase change material layer can be in a range from 5 nm to 600 nm, such as from 20 nm to 300 nm and/or from 40 nm to 150 nm, although lesser and greater thicknesses can also be employed.

The switch device layers include various material layers that can be patterned to provide a two-dimensional array of ovonic threshold switches (OTS) (82, 83, 84, 85, 86) which function as selector elements for the respective memory element 81 in the same memory pillar structures 80. While the memory element 81 is shown as being located below the OTS selector element, in another embodiment shown in FIG. 6A and described below, the memory element 81 is located above the OTS selector element in the same memory pillar structure 80.

The OTS selector element includes a first carbon-containing electrode 92, a second carbon-containing electrode 96 and an ovonic threshold switch material portion 84 located between the first carbon-containing electrode 92 and the second carbon-containing electrode 96. In the first embodiment, the first carbon-containing electrode 92 comprises a first carbon-based electrode 82 and a first metallic layer 83. The second carbon-containing electrode 96 comprises a second metallic layer 85 and a second carbon-based electrode 86.

According to the first embodiment of the present disclosure, the OTS selector element layers can include, from bottom to top, a first carbon-based electrode material layer, a first metallic material layer formed on the first carbon-based electrode material layer, an ovonic threshold selector material layer formed on the first metallic material layer, a second metallic material layer formed on the ovonic threshold selector material layer, and a second carbon-based electrode material layer formed on the second metallic material layer. In this case, each ovonic threshold switch (82, 83, 84, 85, 86) can include, from bottom to top, the first carbon-based electrode 82, the first metallic layer 83 located on the first carbon-based electrode 82, the ovonic threshold switch material portion 84 located on the first metallic layer 83, the second metallic layer 85 located on the ovonic threshold switch material portion 84, and the second carbon-based electrode 86 located on the second metallic layer 85. In one embodiment, each first carbon-based electrode 82 can be a patterned portion of the first carbon-based electrode material layer, each first metallic layer 83 can be a patterned portion of the first metallic material layer, each ovonic threshold switch material portion 84 can be a patterned portion of the ovonic threshold switch material layer, each second metallic layer 85 can be a patterned portion of the second metallic material layer, and each second carbon-based electrode 86 can be a patterned portion of the second carbon-based electrode material layer.

Each ovonic threshold switch material portion 84 within the two-dimensional array of ovonic threshold switches (82, 83, 84, 85, 86) can include any suitable ovonic threshold switch material which exhibits non-linear electrical behavior. As used herein, an ovonic threshold switch material refers to a chalcogen-containing material that displays a non-linear resistivity curve under an applied external bias voltage such that the resistivity of the material decreases with the magnitude of the applied external bias voltage. In other words, the ovonic threshold switch material becomes more conductive under a higher external bias voltage than under a lower external bias voltage. In one embodiment, the chalcogen-containing ovonic threshold switch material layer does not crystallize in a low resistivity state under a voltage above the threshold voltage, and reverts back to a high resistivity state when not subjected to a voltage above a critical holding voltage across the ovonic threshold switch material layer. Thus, the ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material.

In one embodiment, the ovonic threshold switch material can comprise an amorphous chalcogenide material which exhibits hysteresis in both the write and read current polarities. The chalcogenide material may contain S, Se, and/or Te chalcogen material alloyed with Si, Ge, Sn, P, As, and/or Sb, and may be doped with B, C, N, O, and/or In. Exemplary ovonic threshold switch materials include SiTe, GeTe, GeSe, or GeSeAs, with atomic compositions for constituent elements ranging from 5 to 95%. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material can include, and/or can consist essentially of, a material selected from a GeSeAs alloy (e.g., $Ge_{0.01-0.1}As_{0.05-0.7}Se_{0.3-0.7}$, such as $GeO_{0.1}As_{0.35}Se_{0.55}$), GeSeAsTe ("GSAT") alloy (e.g., $Ge_{0.01-0.1}As_{0.05-0.7}Se_{0.3-0.7}Te_{0.03-0.3}$), a GeTeAs alloy, a GeSeTe alloy, a GeSe alloy, a SeAs alloy, a AsTe alloy, a GeTe alloy, a SiTe alloy (e.g., $Si_{0.2}Te_{0.8}$), a SiAsTe alloy, or SiAsSe alloy, with atomic compositions for constituent elements ranging from 5 to 95%. In one embodiment, the ovonic threshold switch material may be undoped or doped with at least one of N, O, C, P, Ge, As, Te, Se, In, or Si In one embodiment, the material of the ovonic threshold switch material layer can be selected such that the resistivity of the selector material therein decreases at least by two orders of magnitude (i.e., by more than a factor of 100) upon application of an external bias voltage that exceeds a critical bias voltage magnitude (also referred to as threshold voltage). In one embodiment, the composition and the thickness of the ovonic threshold switch device layers can be selected such that the critical bias voltage magnitude can be in a range from 1 V to 6 V, although lesser and greater voltages can also be employed for the critical bias voltage magnitude. The thickness of the ovonic threshold switch device layers can be, for example, in a range from 1 nm to 50 nm, such as from 5 nm to 25 nm, although lesser and greater thicknesses can also be employed.

Each first carbon-based electrode 82 and each second carbon-based electrode 86 can include a respective carbon-based conductive material including carbon atoms at an atomic concentration greater than 50%. In one embodiment, the first carbon-based electrodes 82 and the second carbon-based electrodes 86 may include carbon atoms at an atomic concentration in a range from 50% to 100%, such as from 70% to 100% and/or from 80% to 100%. In one embodiment, each of the first carbon-based electrodes 82 and the second carbon-based electrodes 86 comprises a respective material selected from diamond-like carbon (DLC), a carbon nitride material (e.g., nitrogen doped carbon containing 1 to 50 atomic percent nitrogen), and a carbon-rich conductive compound of carbon atoms and non-carbon atoms. Each of the first carbon-based electrodes 82 and second carbon-based electrodes 86 may have a respective thickness in a range from 3 nm to 300 nm, although lesser and greater thicknesses may also be employed.

Each first metallic layer 83 and each second metallic layer 85 can include a respective metallic material having electrical conductivity that is greater than the electrical conductivity of the first carbon-based electrodes 82 and each second carbon-based electrodes 86. In one embodiment, each first metallic layer 83 comprises a first metallic material having electrical conductivity that is at least 10 times (which may be at least 30 times and/or at least 100 times and/or at least 1,000 times, such as 10 to 5,000 times) the electrical conductivity of the first carbon-based electrodes 82, and each second metallic layer 85 comprises a second metallic material having electrical conductivity that is at least 10 times (which may be at least 30 times and/or at least 100 times and/or at least 1,000 times, such as 10 to 5,000 times) the electrical conductivity of the second carbon-based electrodes 86.

Generally, each of the first metallic layers 83 and/or the second metallic layers 85 may comprise, and/or may consist essentially of, a high-conductivity metallic material that has a high electrical conductivity, and thus, is capable of functioning as a current-spreading material that prevents concentration of electrical current in a columnar portion of the ovonic threshold switch material portions 84, and spreads current in the carbon containing layer. In one embodiment, each of the first metallic layers 83 and/or the second metallic layers 85 may comprise, and/or may consist essentially of, an elemental metal, a conductive metallic carbide, or a conductive metallic nitride.

In one embodiment, the first metallic layers 83 and/or the second metallic layers 85 may comprise and/or may consist essentially of a refractory or noble metal. In one embodiment, the first metallic layers 83 and/or the second metallic layers 85 may comprise, and/or may consist essentially of, a respective elemental metal selected from ruthenium, niobium, molybdenum, tantalum, tungsten, titanium or rhenium.

In another embodiment, the first metallic layers 83 and/or the second metallic layers 85 may comprise and/or may consist essentially of an electrically conductive metal carbide, such as tungsten carbide.

In one embodiment, the first metallic layers 83 and/or the second metallic layers 85 may comprise and/or may consist essentially of an electrically conductive metal nitride, such as tungsten nitride, titanium nitride, molybdenum nitride or tantalum nitride.

Generally, the first metallic layers 83 and/or the second metallic layers 85 may have a lesser thickness than the first carbon-based electrodes 82 and the second carbon-based electrodes 86. Each of the first metallic layers 83 and/or the second metallic layers 85 may have a respective thickness in a range from 0.2 nm to 10 nm, such as from 0.5 nm to 5 nm, such as from 1 nm to 2 nm, although lesser and greater thicknesses may also be employed. In one embodiment, the ratio of the thickness of the first carbon-based electrodes 82 to the thickness of the first metallic layers 83 may be in a range from 3 to 500, such as from 10 to 100, although lesser and greater ratios may also be employed. In one embodiment, the ratio of the thickness of the second carbon-based electrodes 86 to the thickness of the second metallic layers 85 may be in a range from 3 to 500, such as from 10 to 100, although lesser and greater ratios may also be employed.

In one embodiment, a two-dimensional array of memory pillar structures 80 can be formed on the first electrically conductive lines 12. Each of the memory pillar structures 80 comprises a series connection of a memory material portion 81 and an ovonic threshold switch (82, 83, 84, 85, 86). The ovonic threshold switch (82, 83, 84, 85, 86) comprises a first carbon-based electrode 82, a first metallic layer 83 located on the first carbon-based electrode 82, an ovonic threshold switch material portion 84 located on the first metallic layer 83, a second metallic layer 85 located on the ovonic threshold switch material portion 84, and a second carbon-based electrode 86 located on the second metallic layer 85.

In one embodiment, each ovonic threshold switch (82, 83, 84, 85, 86) has a pillar shape in which sidewalls of the first carbon-based electrode 82 are vertically coincident with sidewalls of the first metallic layer 83, sidewalls of the ovonic threshold switch material portion 84, sidewalls of the second metallic layer 85, and sidewalls of the second carbon-based electrode 86. As used herein, a first surface and a second surface are vertically coincident if the first surface and the second surface overlie or underlie each other, and if the first surface and the second surface are located within a same vertical plane.

In one embodiment, each memory material portion 81 comprises sidewalls that are vertically coincident with the sidewalls of the first carbon-based electrode 82 within a same memory pillar structure 80. In one embodiment, the two-dimensional array of memory pillar structures 80 comprises a two-dimensional array of series connections of a respective memory material portion 81 and a respective ovonic threshold switch (82, 83, 84, 85, 86) that has a first periodicity (i.e., a first pitch) along a first horizontal direction hd1 and has a second periodicity (i.e., a second pitch) along a second horizontal direction hd2. In one embodiment, the second horizontal direction hd2 may be perpendicular to the first horizontal direction hd1. In one embodiment, each of the first pitch and the second pitch may be in a range from 10 nm to 2,000 nm, such as from 30 nm to 600 nm, although lesser and greater dimensions may also be employed for the first pitch and/or the second pitch.

Figures 4A, 4B:
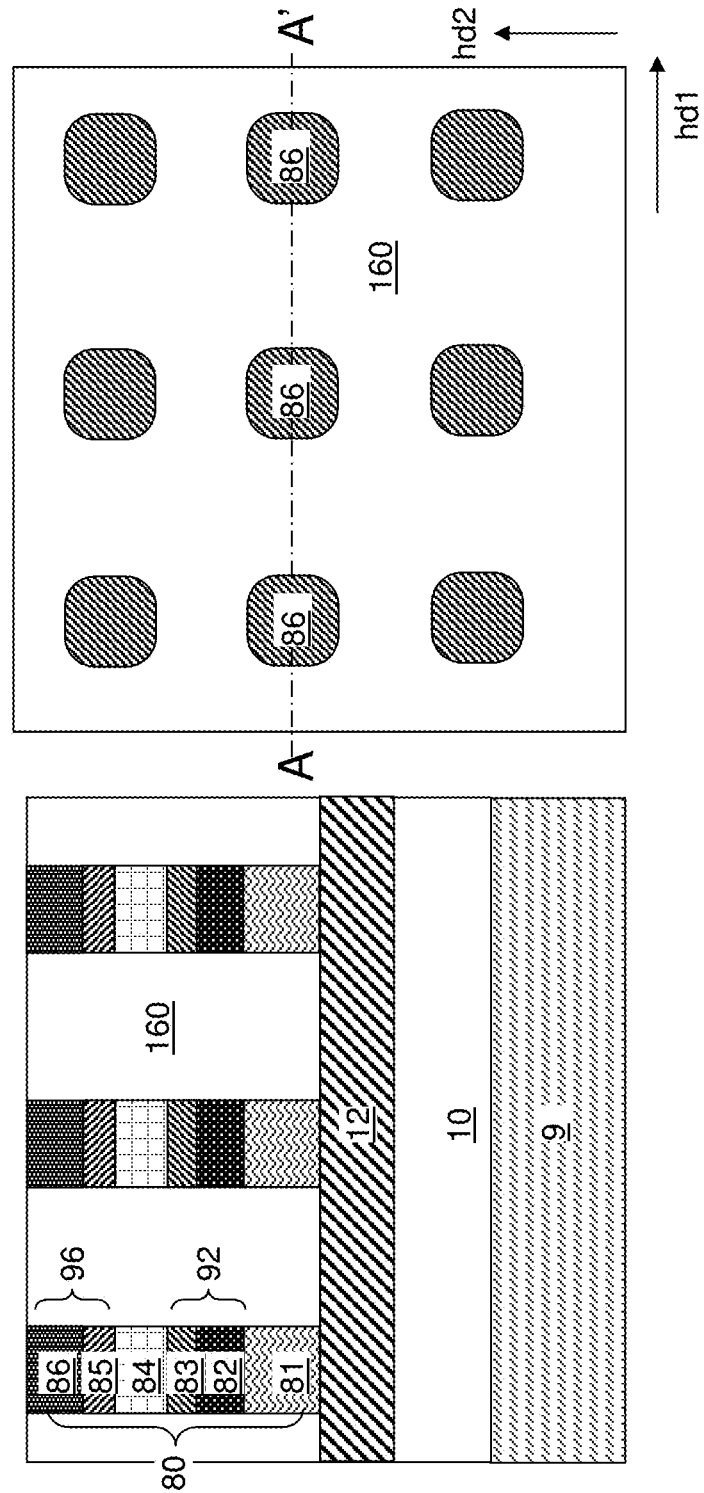
FIG. 4A is a vertical cross-sectional view of the exemplary structure after formation of a dielectric material layer according to the first embodiment of the present disclosure.
FIG. 4B is a top-down view of the exemplary structure of FIG. 4A. The vertical plane A-A' is the plane of the vertical cross-sectional view of FIG. 4A.

Referring to FIGS. 4A and 4B, a dielectric fill material such as undoped silicate glass (e.g., silicon oxide) or a doped silicate glass can be deposited in the gaps between the memory pillar structures 80 within the two-dimensional array of memory pillar structures 80. The dielectric fill material may be deposited by a conformal deposition process such as a chemical vapor deposition process. Optionally, a reflow process may be performed to remove, or reduce, seams that are formed midway between neighboring pairs of the memory pillar structures 80. Excess portions of the dielectric fill material from above the horizontal plane including the top surfaces of the memory pillar structures 80 by performing a planarization process such as a chemical mechanical polishing (CMP) process. The remaining contiguous portion of the dielectric fill material that laterally surround the two-dimensional array of memory pillar structures 80 constitute a dielectric matrix layer 160.

Figures 5A, 5B:
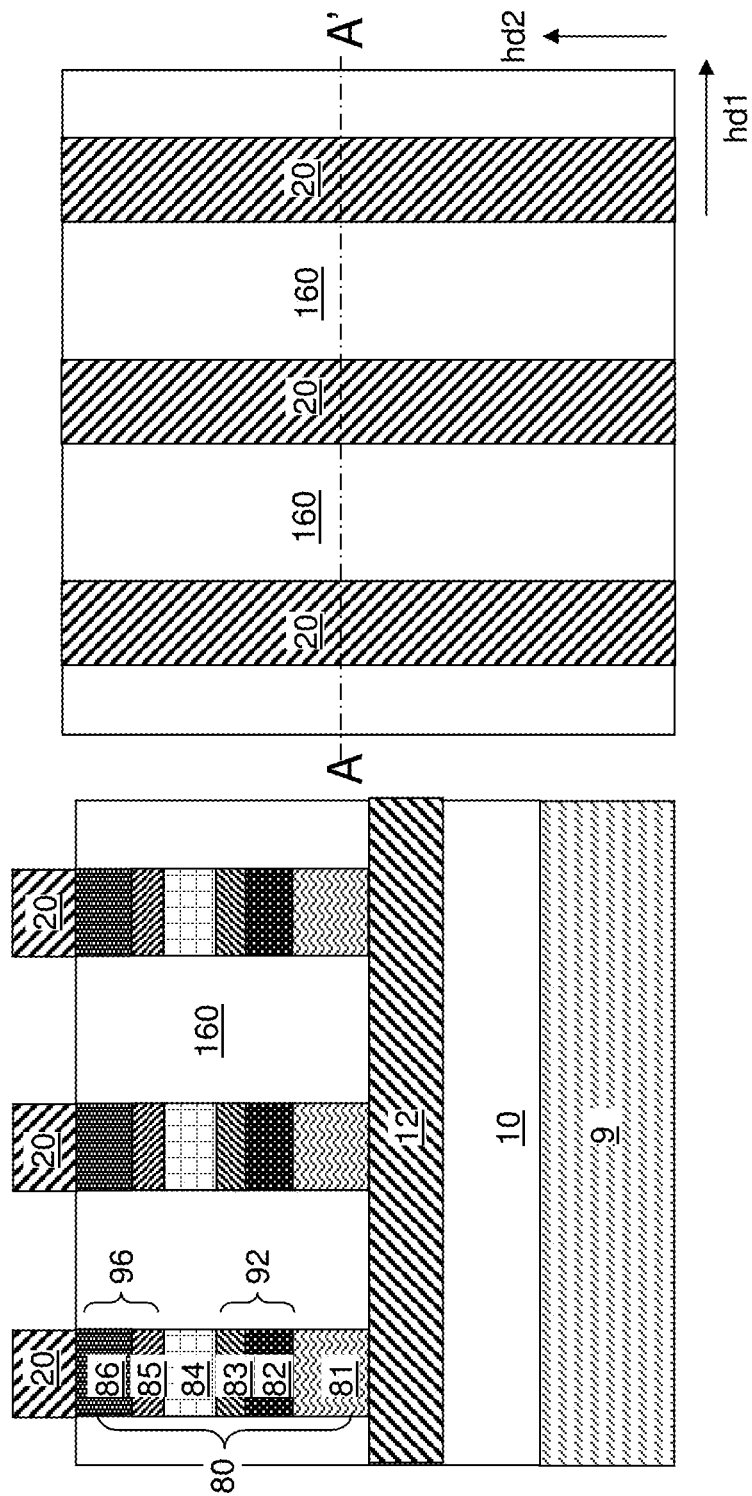
FIG. 5A is a vertical cross-sectional view of the exemplary structure after formation of second conductive lines according to the first embodiment of the present disclosure.
FIG. 5B is a top-down view of the exemplary structure of FIG. 5A. The vertical plane A-A' is the plane of the vertical cross-sectional view of FIG. 5A.

Referring to FIGS. 5A and 5B, second electrically conductive lines 20 laterally extending along the second horizontal direction hd2 can be formed on top surfaces of the memory pillar structures 180. Each second electrically conductive line 20 can contact top surfaces of a respective subset of the two-dimensional array of memory pillar structures 80. For example, each second electrically conductive line 20 can contact top surfaces of a column of memory pillar structures 80 arranged along the second horizontal direction hd2. In one embodiment, the second electrically conductive lines 20 can be formed by depositing at least one conductive material layer and patterning the at least one conductive material layer into a plurality of line structures that contact a respective column of memory pillar structures 80. In another embodiment, an insulating layer (not shown) can be deposited over the memory pillar structures 80 and the dielectric matrix layer 160, and can be patterned to form line trenches laterally extending along the second horizontal direction. Top surfaces of a column of memory pillar structures 80 can be physically exposed at the bottom of each line trench. At least one conductive material can be deposited in the line trenches and can be subsequently planarized to form the second electrically conductive lines 20. Alternatively, the second electrically conductive lines 20 may be formed first, followed by forming the insulating layer between the second electrically conductive lines 20.

Referring to FIGS. 6A and 6B, an alternative configuration of the exemplary structure can be derived from the exemplary structure by forming the ovonic threshold switch device layers prior to formation of the memory material layer. In this case, the memory element 81 may overlie the ovonic threshold switch (82, 83, 84, 85, 86) within each memory pillar structure 80.

Generally, the first electrically conductive lines 12 can laterally extend along the first horizontal direction hd1, and can be electrically connected to a bottom end of a respective row of series connections within the two-dimensional array of series connections of a respective memory material portion 81 and a respective ovonic threshold switch (82, 83, 84, 85, 86) selector element. The second electrically conductive lines 20 can laterally extend along the second horizontal direction hd2, and can be electrically connected to a top end of a respective column of series connections within the two-dimensional array of series connections of a respective memory material portion 81 and a respective ovonic threshold switch (82, 83, 84, 85, 86) selector element.

According to an aspect of the present disclosure, the first metallic layer 83 and/or the second metallic layer 85 within each ovonic threshold switch (82, 83, 84, 85, 86) selector element can decrease a voltage drop (hereafter referred to as V_off) across the ovonic threshold switch material portion 84 while the ovonic threshold switch material portion 84 is in a conductive state.

Figure 7:
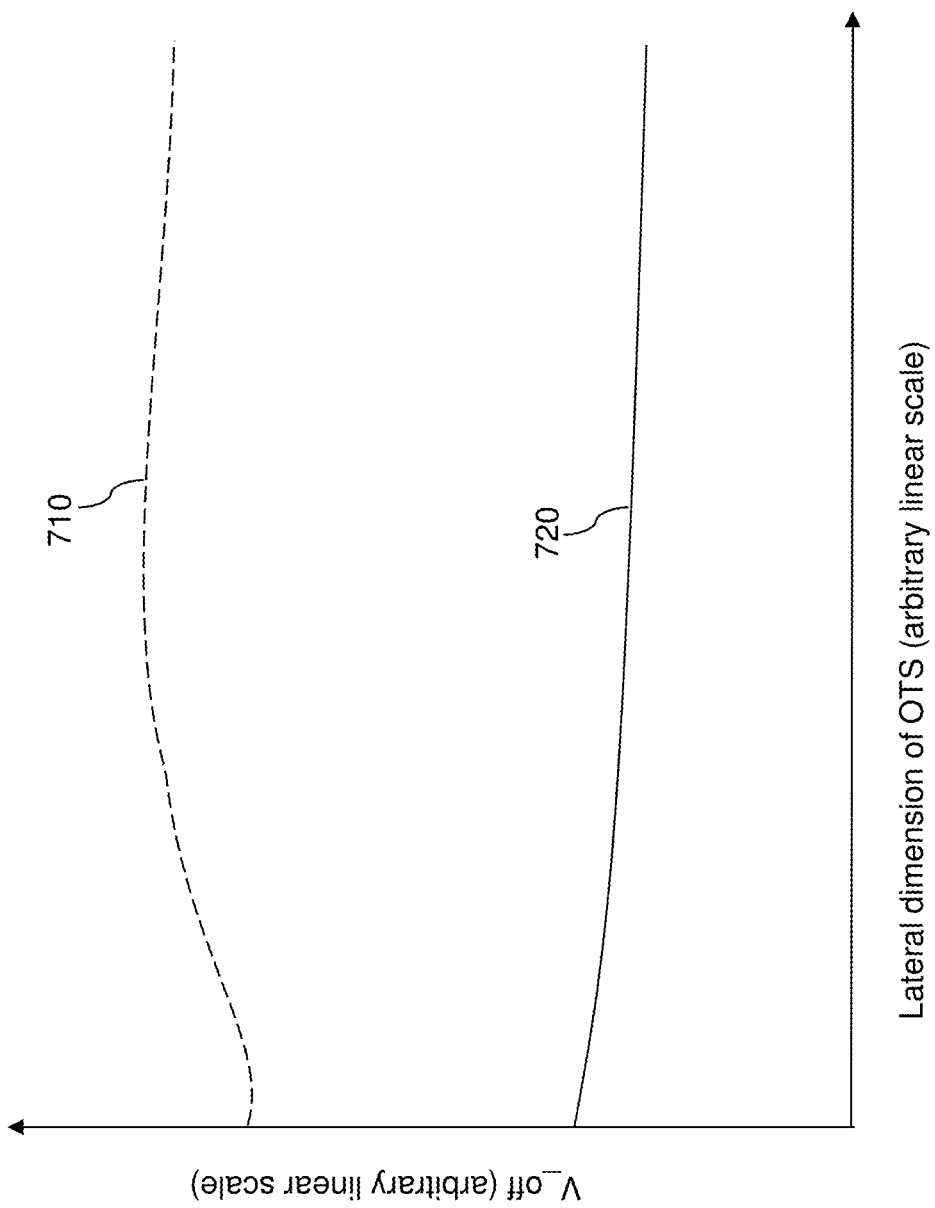
FIG. 7 is a schematic graph illustrating V_off for a comparative exemplary ovonic threshold switch and an ovonic threshold switch according to the first embodiment of the present disclosure.

Referring to FIG. 7, the on-state voltage drop across an ovonic threshold switch material portion is illustrated for a comparative exemplary ovonic threshold switch and an exemplary ovonic threshold switch according to an embodiment of the present disclosure. In this illustrative example, the comparative exemplary ovonic threshold switch is derived from the ovonic threshold switch of the first embodiment of the present disclosure by omitting the first metallic layer 83 and the second metallic layer 85. Thus, the comparative exemplary ovonic threshold switch consists of the first carbon-based electrode, the ovonic threshold switch material portion, and the second carbon-based electrode. The exemplary ovonic threshold switch according to the first embodiment of the present disclosure comprises, from one side to another, the first $CN_x$ carbon-based electrode 82, the first TiN metallic layer 83, the GSAT ovonic threshold switch material portion 84, the second TiN metallic layer 85, and the second $CN_x$ carbon-based electrode 86 as described above. For the purpose of comparison, the dimensions and material compositions of each of the first carbon-based electrodes 82, the ovonic threshold switch material portions 84, and the second carbon-based electrodes 86 are the same across the comparative exemplary ovonic threshold switch and the exemplary ovonic threshold switch of the present disclosure.

A first curve 710 illustrates the on-state voltage drop V_off across the ovonic threshold switch material portion for the comparative exemplary ovonic threshold switch, and a second curve 720 illustrates the on-state voltage drop across the ovonic threshold switch material portion 84 for the exemplary ovonic threshold switch. The magnitude of the on-state voltage drop V_off 710 across the ovonic threshold switch material portion for the comparative exemplary ovonic threshold switch may be 0.2 V to 1.2 V greater than the on-state voltage drop V_off 720 across the ovonic threshold switch material portion 84 of the exemplary ovonic threshold switch (82, 83, 84, 85, 86) according to the first embodiment of the present disclosure.

Generally, the ovonic threshold switch (82, 83, 84, 85, 86) operates as a thresholding device that switches between an insulating state and a conducting state depending on whether the applied external bias voltage is greater than a threshold voltage (Vt). Once the ovonic threshold switch (82, 83, 84, 85, 86) selector element is turned on, a residual voltage drop (which is the on-state voltage drop V_off) is present across the ovonic threshold switch material portion 84 along with intrinsic to the OTS voltage drop of the conductive state. The on-state voltage drop V_off is a parasitic voltage drop across the two electrodes of the ovonic threshold switch (82, 83, 84, 85, 86) selector element that is present when the ovonic threshold switch material portion 84 functions as a conductive element.

Use of carbon-based materials for the first electrode and the second electrode of the ovonic threshold switch (82, 83, 84, 85, 86) selector element can facilitate scaling and fabrication of the ovonic threshold switch (82, 83, 84, 85, 86) selector element. However, the high resistance of carbon-based materials can significantly increase the on-state voltage drop V_off. An increase in the on-state voltage drop V_off can induce formation of filamentary-type conduction paths within the ovonic threshold switch material portion 84, and can further exacerbate the on-state voltage drop V_off by inducing a point-like current injection pattern into the ovonic threshold switch material portion 84. The current injection region within the OTS electrodes may have a funnel-shape, and only a small fraction of the volume of the electrodes is used for electrical current conduction during an on-state and the parasitic voltage drop in the electrodes increases.

According to the first embodiment of the present disclosure, the first metallic layer 83 and/or the second metallic layer 85 of the ovonic threshold switch (82, 83, 84, 85, 86) selector element induces current spreading across the entire volume of the first carbon-based electrode 82 and the second carbon-based electrode 86. Accordingly, the on-state voltage drop V_off of the ovonic threshold switch (82, 83, 84, 85, 86) selector element of the first embodiment of the present disclosure can be reduced relative to the on-state voltage drop V_off of the comparative exemplary ovonic threshold switch selector element that does not employ metallic layers therein.

In summary, the voltage drop across the electrodes is reduced because the current is spread by the metallic layers (83, 85). The threshold voltage is also lower, but is shunted with the high resistance of the ovonic threshold switch material portion 84 (e.g., GSAT, etc. portion). V_off is also lower because the non-linear part is reduced to the larger effective active area of the electrodes. The parasitic voltage drop is also decreased and/or eliminated. Therefore, the write quality of the memory element 81, such as an MRAM cell, can be improved.

In the second embodiment, rather than forming separate metallic layers and carbon-based electrodes of the first embodiment, each electrode comprises an alloy containing a metal and carbon. The alloy increases the conductivity of the electrodes. Therefore, separate metallic layers of the first embodiment are not required to increase the conductivity and current spreading of the carbon-based electrodes.

Figure 8B:
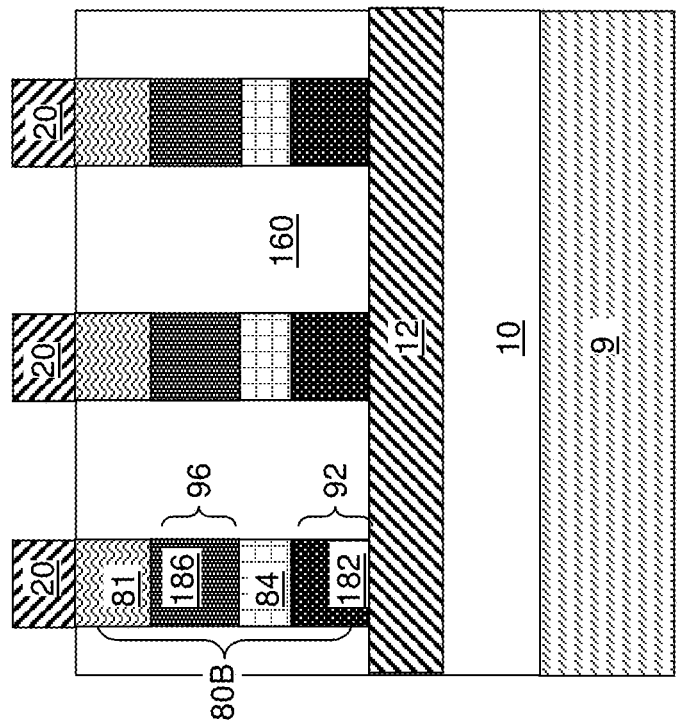
FIGS. 8A and 8B are vertical cross-sectional view of alternative configurations of a second exemplary structure after formation of second conductive lines according to a second embodiment of the present disclosure
Figure 8A:
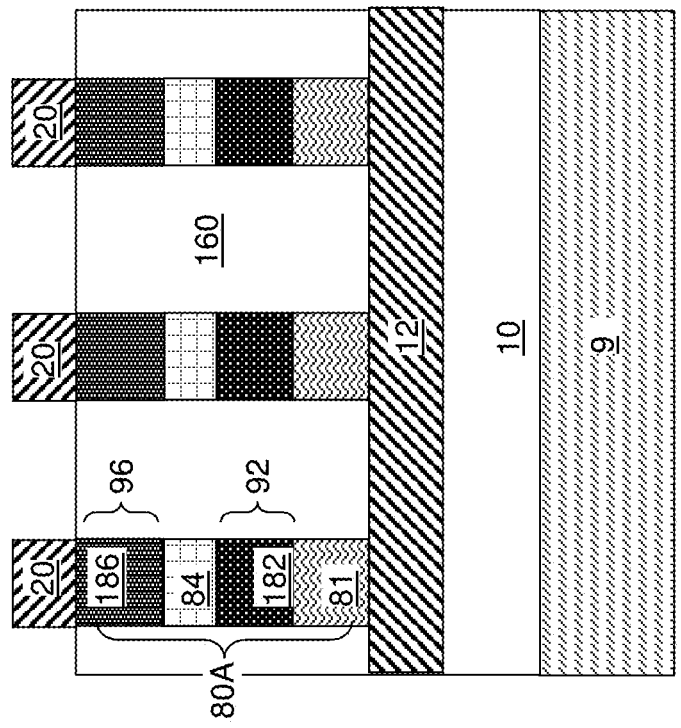

FIGS. 8A and 8B illustrate alternative memory pillar structures 80A and 80B according to the second embodiment. In FIG. 8A, the memory element 81 is located below the OTS selector element. In FIG. 8B, the memory element 81 is located above the OTS selector element. The memory pillar structures 80A and 80B of FIGS. 8A and 8B can be derived from the respective memory pillar structures 80 of FIGS. 5A and 6A by replacing the metallic layers (83, 85) and the carbon based electrodes (82, 86) with first and second metal-carbon alloy electrodes (182, 186). In the second embodiment, the first carbon-containing electrode 92 comprises a first metal-carbon alloy electrode 182 and the second carbon-containing electrode 96 comprises a second metal-carbon alloy electrode 186.

The first and second metal-carbon alloy electrodes (182, 186) may contain 1 to 50 atomic percent metal, such as 5 to 25 atomic percent metal, and remainder carbon and optionally nitrogen and unavoidable impurities. For example, the first and second metal-carbon alloy electrodes (182, 186) may contain 1 to 50 atomic percent metal, such as 5 to 25 atomic percent metal, and 70 to 99 atomic percent carbon, such as 75 to 95 atomic percent carbon. Alternatively, the first and second metal-carbon alloy electrodes (182, 186) may contain 1 to 50 atomic percent metal, such as 5 to 25 atomic percent metal, 10 to 40 atomic percent nitrogen, and 50 to 85 atomic percent carbon, such as 60 to 80 atomic percent carbon. The metal in the metal-carbon alloy may be selected from one or more of ruthenium, niobium, molybdenum, tantalum, tungsten, titanium or rhenium. For example, the alloy may comprise 1 to 50 atomic percent tungsten and remainder carbon, or 1 to 50 atomic percent titanium and remainder carbon and nitrogen (e.g., an alloy of carbon and titanium nitride, i.e., titanium carbonitride).

The metal-carbon alloys may be produced by chemical vapor deposition or physical vapor deposition. For example, the alloys may be produced by co-sputtering from metal and carbon targets or by sputtering from a composite metal-carbon alloy target.

Adding a metal to the carbon-based electrodes reduces the electrode resistivity. Thus, current spreading in lower resistivity material provides a more uniform current density across the electrode material. This improves both the threshold voltage Vt and the magnitude and distribution of V_off. Thus, the relatively high conductivity current metal-carbon alloy electrodes function as the current spreading layer.

FIGS. 9A and 9B illustrate alternative memory pillar structures 80C and 80D according to the second embodiment. In FIG. 9A, the memory element 81 is located below the OTS selector element. In FIG. 9B, the memory element 81 is located above the OTS selector element. The memory pillar structures 80C and 80D of FIGS. 9A and 9B can be derived from the respective memory pillar structures 80A and 80B of FIGS. 8A and 8B by adding electrically conductive first and second barrier layers (183, 185) between the ovonic threshold switch material portion 84 and the respective first and second metal-carbon alloy electrodes (182, 186). In the third embodiment, the first carbon-containing electrode 92 comprises the first metal-carbon alloy electrode 182 and a first barrier layer 183. The second carbon-containing electrode 96 comprises the second metal-carbon alloy electrode 186 and the second barrier layer 185.

For example, the metal, such as tungsten, from the metal-carbon alloy electrodes (182, 186) may undesirably diffuse into the ovonic threshold switch material portion 84 during device operation. Such mixing of metal atoms into the chalcogenide material of the ovonic threshold switch material portion 84 may negatively impact the selector element operation, increase leakage, reduce cycling capability, negatively impact endurance, and even possibly remove thresholding features from the device current-voltage curve.

In contrast, the material of the barrier layers (183, 185) is typically stable in contact with the ovonic threshold switch material portion 84, does not provide significant diffusion in atoms into the ovonic threshold switch material portion 84, and acts as a diffusion barrier to prevent or reduce metal (e.g., tungsten) diffusion from the metal-carbon alloy electrodes (182, 186) into the ovonic threshold switch material portion 84.

The barrier layers (183, 185) may comprise titanium nitride and/or a carbon-based material, such as diamond-like carbon or nitrogen doped carbon. In one embodiment, each of the barrier layers (183, 185) may comprise a bi-layer containing a TiN sublayer and a carbon-based sublayer. If the bi-layer barrier layers are used, then either the TiN sublayer or the carbon-based sublayer may contact the ovonic threshold switch material portion 84. The barrier layers (183, 185) are preferably thinner than the metal-carbon alloy electrodes (182, 186). For example, the barrier layers (183, 185) may have a thickness of 0.5 nm to 20 nm, such as 1 nm to 10 nm, for example 1 nm to 5 nm.

In an alternative configuration of the third embodiment, since the opposing surfaces of the ovonic threshold switch material portion 84 are protected by the barrier layers (183, 185), the material of the electrodes (182, 186) may comprise a metallic material which contains more than 50 atomic percent metal, such as 60 to 100 atomic percent metal. The electrodes (182, 186) may optionally contain 0 to 40, such as 1 to 40 atomic percent carbon and/or nitrogen. The metal of the metallic electrodes (182, 186) may comprise ruthenium, niobium, molybdenum, tantalum, tungsten, titanium or rhenium.

Figure 10:
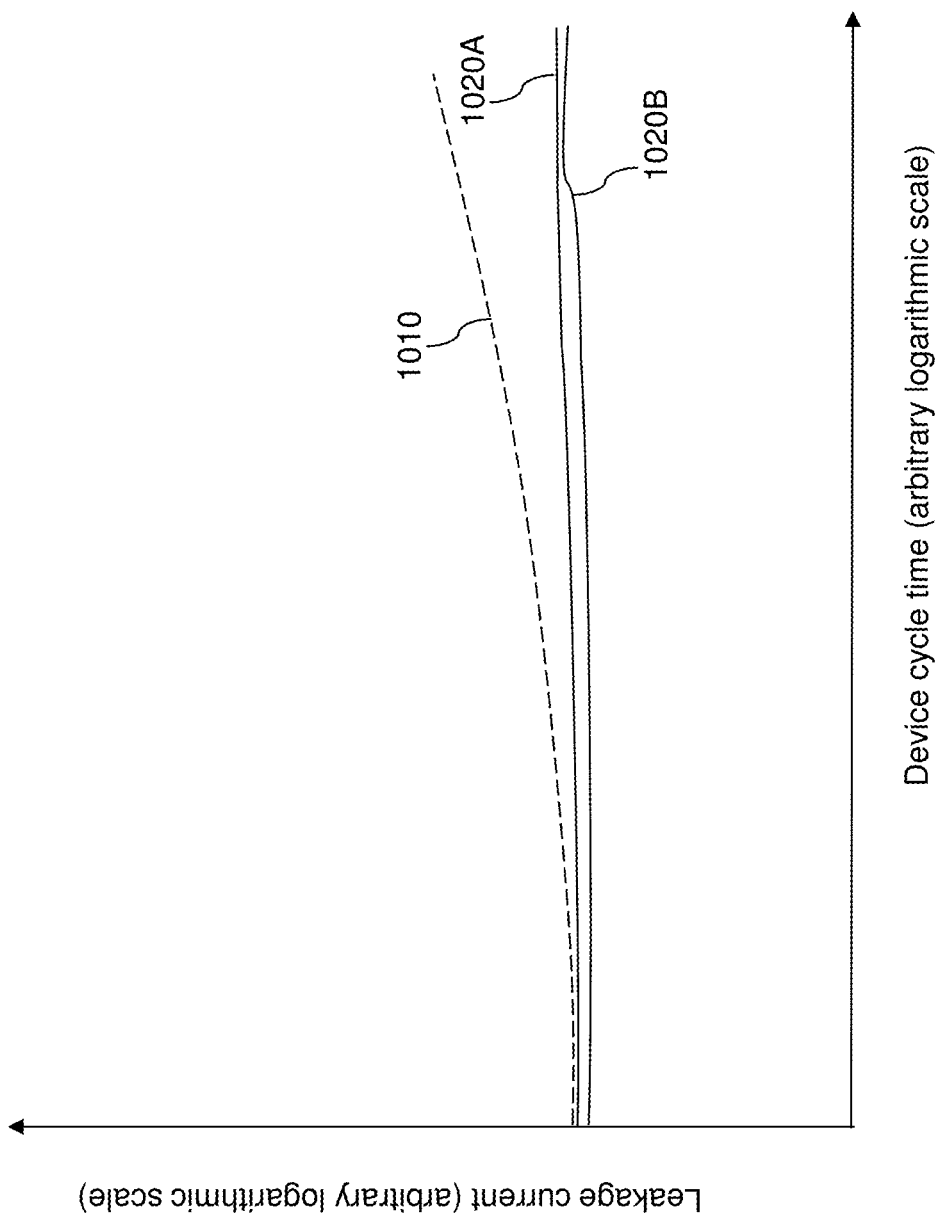
FIG. 10 is a schematic graph illustrating leakage current as a function of device cycle time for a comparative exemplary ovonic threshold switch and an ovonic threshold switch according to the third embodiment of the present disclosure.

Referring to FIG. 10, leakage current during an off state (i.e., when the ovonic threshold switch material portion is in the insulating state at Vt) as a function of the number of device cycles between the on state and the off state is illustrated for the comparative exemplary ovonic threshold switch and the ovonic threshold switch selector elements of the third embodiment of the present disclosure. All three selector elements include GSAT ovonic threshold switch material portion 84 and tungsten carbide electrodes (182, 186). However, the ovonic threshold switch selector elements of the third embodiment of the present disclosure also include either 10 nm nitrogen doped carbon barrier layers (183, 185) or a bi-layer containing 2 nm TiN and 10 nm nitrogen doped carbon barrier layers (183, 185).

A first curve 1010 illustrates the off-state leakage current across the comparative exemplary ovonic threshold switch selector element, and a second and third curves 1020A and 1020B illustrate the off-state leakage current across the exemplary ovonic threshold switch selector elements of the third embodiment. As shown in FIG. 10, the first curve 1010 shows an increasing leakage current as the number of cycles increases, which is believed to be due to diffusion of tungsten from tungsten carbide alloy electrodes into the ovonic threshold switch material portion 84. However, the second and third curves 1020A and 1020B have a smaller increase in leakage current as the number of cycles increases. Without wishing to be bound by a particular theory, it is believed that the reduction in leakage current results because the barrier layers prevent or reduce the tungsten diffusion from the tungsten carbide electrodes into the ovonic threshold switch material portion 84. Thus, the endurance of the selector element of the third embodiment may be at least $10^8$ cycles.

Thus, the structures and methods of the embodiments of the present disclosure can provide an ovonic threshold switch selector element providing a superior device performance both in terms of the on-state voltage drop and the off-state leakage current.

In the fourth and fifth embodiments, the ovonic threshold switch (OTS) material of the ovonic threshold switch material portion 84 is subjected to a microwave anneal by being irradiated by microwave radiation. Microwave radiation may have frequencies in range between 300 MHz and 300 GHz, such as frequencies in a range between 1 and 100 GHz, such as between 3 and 30 GHz (which correspond to wavelengths between one meter and one millimeter, such as between 0.3 m and 3 mm, such as between 10 cm and 1 cm). The microwave radiation heats the OTS material during the microwave annealing. Without wishing to be bound by a particular theory, it is believed that the microwave annealing may reduce the minimum "first fire" voltage of the ovonic threshold switch material portion 84 without negatively impacting an operating (i.e., subsequent) programming voltage and device characteristics. The "first fire" voltage is an initial (i.e., first) forming voltage applied to the ovonic threshold switch material portion 84 via the respective bit line 12 and word line 20 to turn on the ovonic threshold switch material portion 84. Specifically, the OTS material undergoes the initial forming process by applying a high electric field. Because of its large overshoot current, the initial forming process can be a burden on the circuit design, as well as deteriorate the switching and reliability characteristics of the memory device. However, the microwave annealing provides the OTS selector with low initial forming voltage (i.e., low first fire voltage), high endurance and reduced threshold voltage drift while maintaining good switching characteristics, such as a low off current.

Without wishing to be bound by a particular theory, it is believed that the microwave annealing improves device characteristics by causing structural changes within the OTS material. For example, it is believed that the microwave annealing may cause formation of conducting clusters, such as medium range order (MRO) structures, and conversion of delocalized defects to localized defects in the OTS material, leading to the lower first fire voltage. Since the first fire forming damage is reduced by the microwave annealing, improved switching endurance and reduced threshold voltage drift may be obtained. Without wishing to be bound by a particular theory, it is believed that the drift phenomenon may be caused by the reduction of the delocalized defects. When all delocalized defects are converted to localized defects, the OTS material returns to its initial state. It is believed that the initial state may be permanently changed by the microwave annealing (e.g., by formation of the conducting clusters), which leads to improved drift phenomenon.

In one embodiment, the present inventors realized that microwave radiation negatively interacts with metallic materials exposed to the microwave radiation, and causes sparking and other deleterious effects. The sparking may damage the memory device. Therefore, the in the fourth and fifth embodiments of the present disclosure, metallic material is not exposed to the microwave radiation during the microwave annealing of the OTS material. Thus, the microwave annealing of an OTS material layer occurs without exposing any metallic material to microwave radiation during the microwave annealing. During the microwave annealing of the OTS material, the in-process device may include one or more layers of a metallic material, such as the bit lines 12, the first metallic layer 83, the first metal-carbon alloy electrode 182 and/or the conductive first barrier layer 183. In various aspects of the fourth and fifth embodiments, the sidewalls one or more layers of the metallic material are covered by one or more overlying non-metallic layers or by electrically insulating metal oxide sidewall spacers, respectively. Therefore, the metallic material layer sidewalls are covered and not exposed to microwave radiation during the microwave annealing of the OTS material.

Referring to FIGS. 11A and 11B, a continuous metallic bit line layer 12L is formed over the insulating layer. The metallic bit line layer 12L comprises at least one electrically conductive material, and may include a metallic liner material, such as TiN, TaN, and/or WN and a metallic fill material, such as W, Cu, Co, Mo, Ru, another metal, or an intermetallic ally.

Referring to FIGS. 12A and 12B, the continuous metallic bit line layer 12L is patterned into bit lines 12 by any suitable method, such as photolithography and etching. In this configuration of the fourth embodiment, the ends (i.e., end sidewalls) of the patterned bit lines 12 are offset from the edge of the insulating layer 10 and the edge of the substrate 9.

Figure 13B:
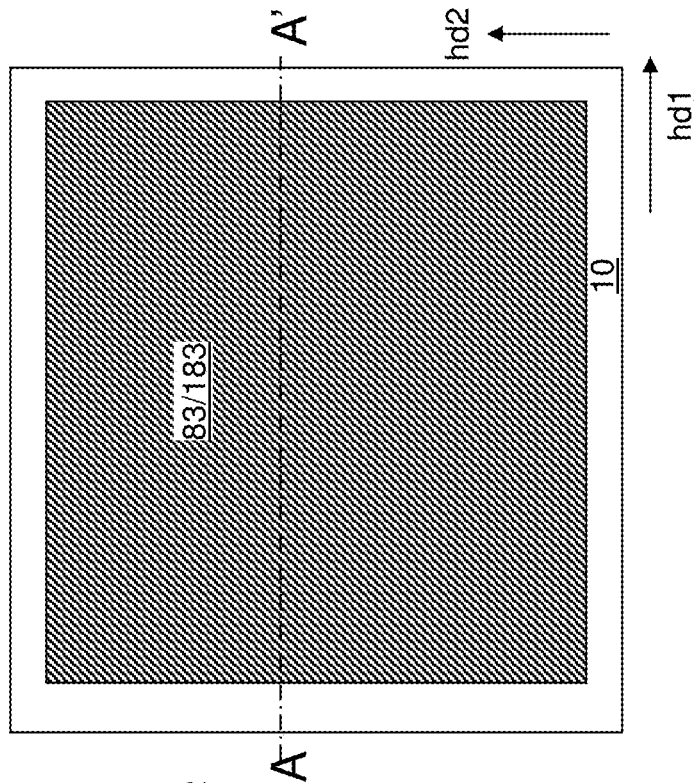
Figure 13A:
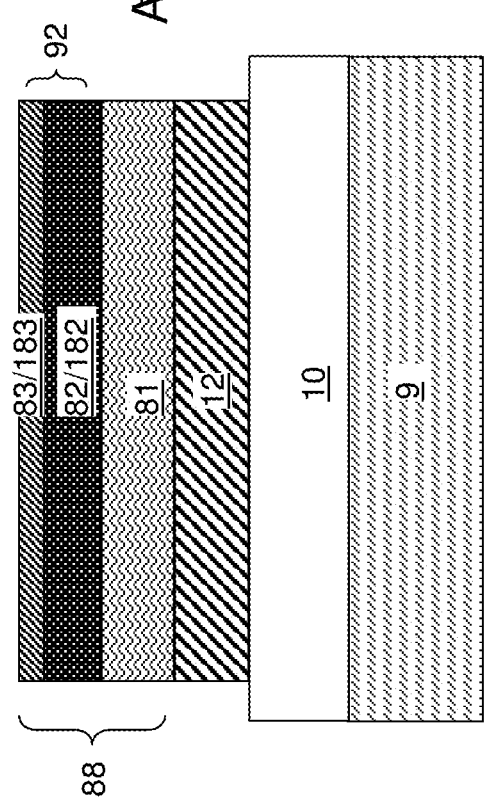

Referring to FIGS. 13A and 13B, a layer stack 88 including the memory element 81 layer and a first electrode 92 layer are formed over the bit lines 12. The first electrode 92 layer may include the first carbon-based electrode 82 layer and the first metallic layer 83. Alternatively, the first electrode 92 layer may include the first metal-carbon alloy electrode 182 layer and the conductive first barrier layers 183. The layer stack 88 is patterned by any suitable methods, such as photolithography and etching, such that the edges (i.e., sidewalls) of the layer stack 88 are offset from the edge of the insulating layer 10 and the edge of the substrate 9.

In an alternative embodiment, the separate bit line 12 patterning step shown in FIGS. 12A and 12B may be omitted. In this alternative embodiment, the bit line layer 12L and the overlying layer stack 88 may be patterned together during the same photolithography and etching step to form the layer stack 88 rails overlying the bit lines 12, as shown in FIG. 13A.

Referring to FIGS. 14A and 14B, an OTS material layer 84L is formed over the bit lines 12 and the patterned layer stack 88. The OTS material layer 84L may comprise any materials described above which are used to form the above described ovonic threshold switch material portions 84. Since the bit lines 12 and the patterned layer stack 88 are offset from the edges of the insulating layer 10 and the edges of the substrate 9, the OTS material layer 84L is formed over the edges (i.e., sidewalls) of the bit lines 12 and the patterned layer stack 88. Thus, the OTS material layer 84L covers the sidewalls of the bit lines 12 and the patterned layer stack 88 such that no metallic material of the bit lines 12 and layers 83, 182 and/or 183 of the patterned layer stack is exposed. Furthermore, if the memory element 81 includes at least one metallic layer, then OTS material layer 84L also covers the sidewalls of the memory element 81 such that no metallic material of the memory element 81 is exposed. For example, the memory element 81 may comprise the MRAM memory element containing metallic materials (e.g., ferromagnetic free and reference layers, such as CoFe or CoFeB alloy layers). In this case, the sidewalls of the MRAM memory element 81 are covered by the OTS material layer 84L.

The OTS material layer 84L is then irradiated with microwave radiation 100 to anneal the OTS material layer 84L. Since no metallic material is exposed to the microwave radiation 100, the sparking of the metallic material(s) and resulting damage is avoided during the microwave annealing.

Any suitable microwave annealing parameters may be used. In one embodiment, the microwave annealing may be conducted in a nitrogen ambient or another suitable ambient, such as a noble gas ambient. Any suitable microwave power may be used, such as 500 W to 2000 W, such as 1000 W to 1500 W. The microwave annealing may raise the temperature of the OTS material layer 84L to any temperature that does not crystallize the OTS material layer 84L, such as 75 to 300 degrees Celsius, such as 200 to 250 degrees Celsius. In one embodiment, the OTS material layer 84L is substantially amorphous both before and after the microwave annealing. The microwave radiation 100 may be provided continuously or in a pulsed manner (i.e., in a continuous or pulsed mode), as long as the OTS material layer 84L is substantially amorphous after the microwave annealing.

In the continuous microware annealing mode, the OTS material layer 84L is continuously heated to a predetermined temperature for a predetermined duration by the microwave radiation 100. The duration may be 1 second to 120 seconds, such as 15 to 35 seconds. The duration and power of the microwave annealing should not exceed values which would cause crystallization of the OTS material layer 84L, since the OTS material layer 84L should be amorphous after the microwave annealing.

In the pulsed microware annealing mode, two or more pulses, such as 2 to 100 pulses of microwave radiation 100 are applied to the OTS material layer 84L. Any suitable pulse duration may be used, such as 0.01 to 10 seconds, such as 0.1 to 1 seconds. Various combinations of different pulses may be used (e.g., pulses with different ramp and/or cooling rates, pulses with different shapes, power and/or duration, and/or regular or irregular pulse application over time). In the intervals between the microwave pulses, the OTS material layer 84L is rapidly cooled (e.g., quenched). This may permit the OTS material layer 84L to remain amorphous during and after the microwave annealing. The pulsed mode may provide a higher energy exposure (i.e., larger electric field and higher temperature during the pulses) than the continuous mode. Furthermore, the total microwave annealing time in the pulsed mode (i.e., the sum of the time of all microwave pulses) may be shorter than the microwave annealing time in the continuous mode, which may permit the OTS material layer 84L to remain amorphous during and after the microwave annealing.

Referring to FIGS. 15A and 15B, the second electrode 96 layer is formed over the OTS material layer 84. The second electrode 96 layer may comprise the second metallic layer 85 and the second carbon-based electrode 86 layer. Alternatively, the second electrode 96 layer may comprise the second metal-carbon alloy electrode 186 layer and optionally the conductive second barrier layer 185.

The above described process steps of FIGS. 4A and 4B and FIGS. 5A and 5B are then carried out on the structure of FIGS. 15A and 15B to form the exemplary structure shown in FIGS. 5A and 5B. In other words, the layers shown in FIG. 15A are patterned into the memory pillar structures 80 shown in FIG. 5A. Since the formation of the memory pillar structures 80 removes the edges of the layers overlying the bit lines 12, the exemplary structure of the fourth embodiment may be identical to that shown in FIGS. 5A and 5B. Alternatively, if the bit lines 12 of the first embodiment extend to the edge of the substrate 9, then the exemplary structure of the fourth embodiment may have shorter bit lines 12 that are offset from the edge of the substrate 9 compared to the bit lines 12 of the exemplary structure of the first embodiment shown in FIGS. 5A and 5B.

Referring to FIGS. 16A and 16B, in a first alternative exemplary structure of the first alternative aspect of the fourth embodiment, the memory element 81 is formed above the ovonic threshold switch material portion 84, similar to the second embodiment described above with respect to FIGS. 6A and 6B. As described above with respect to FIGS. 12A and 12B, the continuous metallic bit line layer 12L is patterned into bit lines 12 having ends (e.g., sidewalls) offset from the edges of the insulating layer 10 and the substrate 9. As described above with respect to FIGS. 13A and 13B, the first electrode 92 layer is formed over the bit lines 12 and patterned such that the edges of the first electrode 92 layer are offset from the edges of the insulating layer 10 and the substrate 9. Alternatively, as also described above, the bit line layer 12L may be patterned into bit lines 12 together with patterning the first electrode 92 layer.

Referring to FIGS. 17A and 17B, the OTS material layer 84L is formed over the bit lines 12 and the patterned first electrode 92 layer. Since the bit lines 12 and the patterned first electrode 92 layer are offset from the edges of the insulating layer 10 and the edges of the substrate 9, the OTS material layer 84L is formed over the edges (i.e., sidewalls) of the bit lines 12 and the patterned first electrode 92 layer. Thus, the OTS material layer 84L covers the sidewalls of the bit lines 12 and the patterned first electrode 92 layer such that no metallic material of the bit lines 12 and layers 83, 182 and/or 183 of the patterned layer stack is exposed. The OTS material layer 84L is then irradiated with microwave radiation 100 to anneal the OTS material layer 84L, as described above.

Figure 18A:
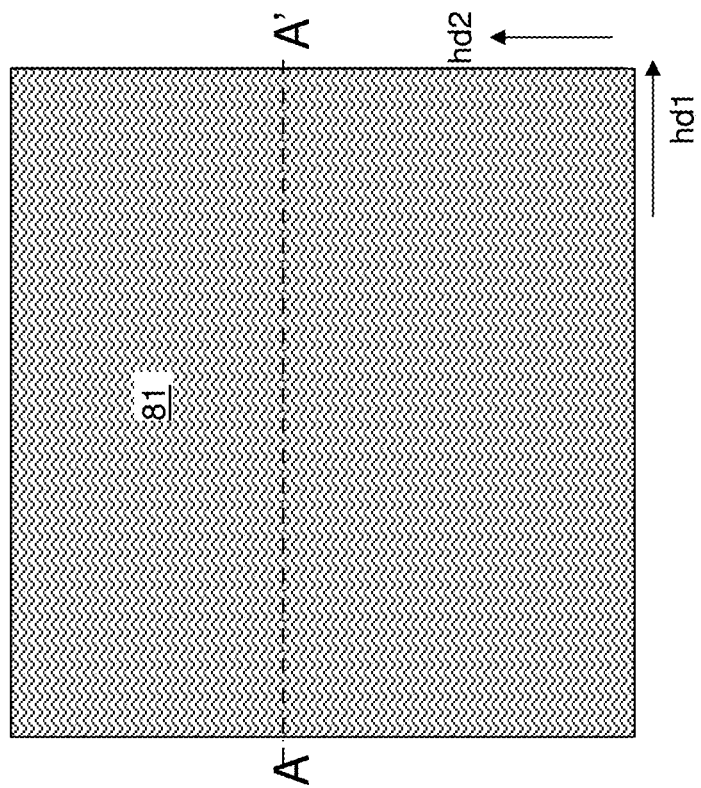
Figure 18B:
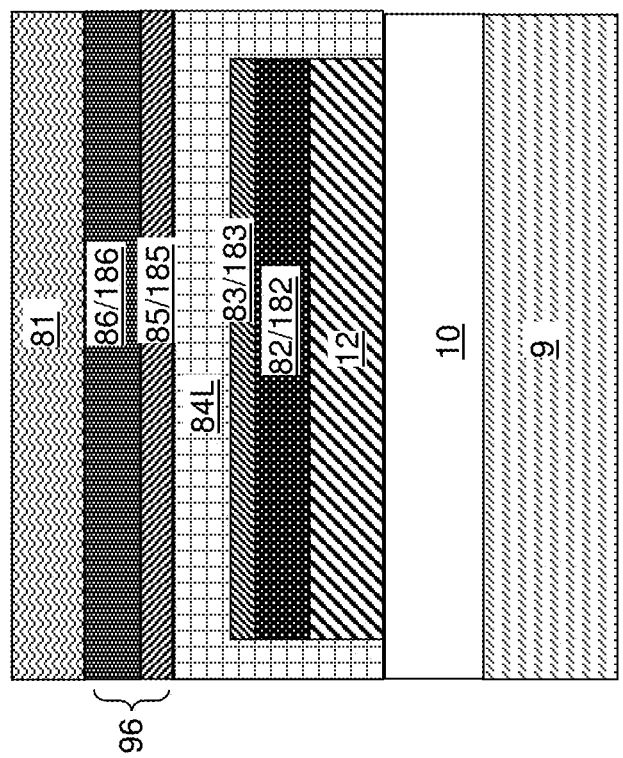

Referring to FIGS. 18A and 18B, the second electrode 96 layer is formed over the OTS material layer 84 and the memory element 81 layer is formed over the second electrode 96 layer. The second electrode 96 layer may comprise the second metallic layer 85 and the second carbon-based electrode 86 layer. Alternatively, the second electrode 96 layer may comprise the second metal-carbon alloy electrode 186 layer and optionally the conductive second barrier layers 185. The above described process steps of FIGS. 6A and 6B are then carried out on the structure of FIGS. 18A and 18B to form the exemplary structure shown in FIGS. 6A and 6B.

Figure 19B:
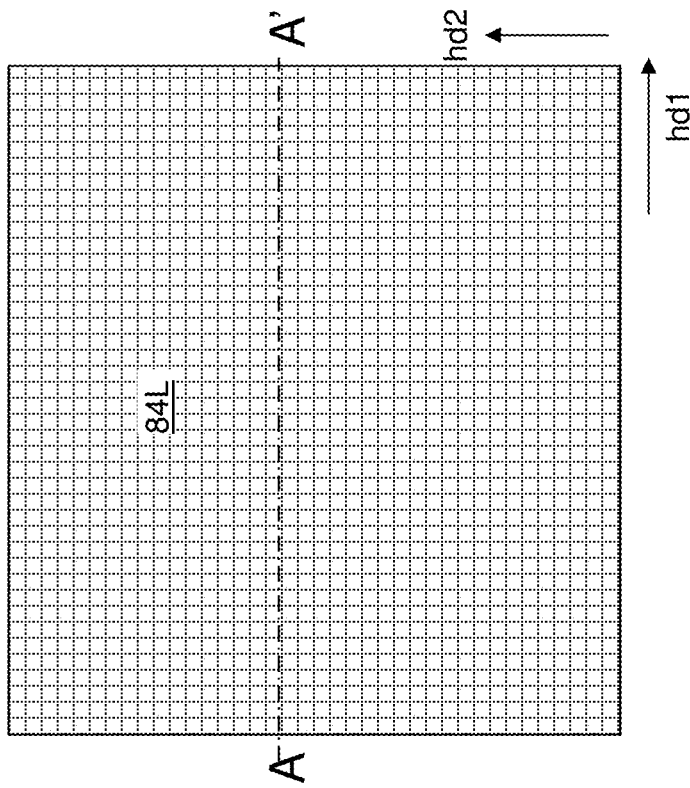
Figure 19A:
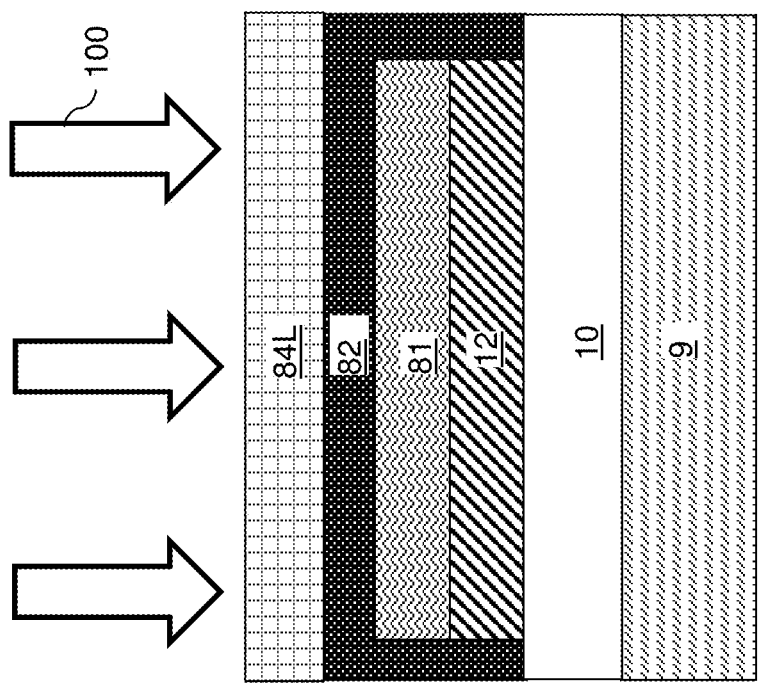

Referring to FIGS. 19A and 19B, in a second alternative exemplary structure of the second alternative aspect of the fourth embodiment, the first electrode 92 layer lacks any metallic layers or elements. Thus, the second alternative exemplary structure of FIGS. 19A and 19B differs from the exemplary structure of the fourth embodiment shown in FIGS. 14A and 14B in that the first electrode 92 layer includes only the non-metallic first carbon-containing electrode 82 layer. In this second alternative exemplary structure, only the bit lines 12 and optionally the memory element 81 layer (if it contains a metallic material) are offset from the edges of the insulating layer 10 and the substrate 9. The non-metallic first electrode 92 layer (i.e., the first carbon-containing electrode 82 layer) does not need to be patterned at this process step. The first carbon-containing electrode 82 layer covers the offset sidewalls of the bit lines 12 and optionally the memory element 81 layer.

The OTS material layer 84L is formed over the bit lines 12, the memory element 81 layer and the first electrode 92 layer, as described above. The OTS material layer 84L is then irradiated with microwave radiation 100 to anneal the OTS material layer 84L, as described above. The above described process steps of FIGS. 4A and 4B and FIGS. 5A and 5B are then carried out on the structure of FIGS. 19A and 19B to form the second alternative exemplary structure shown in FIGS. 20A and 20B.

Referring to FIGS. 21A and 21B, in a third alternative exemplary structure of the third alternative aspect of the fourth embodiment, the first electrode 92 layer also lacks any metallic layers or elements, and the memory element 81 is formed above the ovonic threshold switch material portion 84, similar to the second embodiment described above with respect to FIGS. 6A and 6B. Thus, the third alternative exemplary structure of FIGS. 21A and 21B differs from the first alternative exemplary structure of the fourth embodiment shown in FIGS. 17A and 17B in that the first electrode 92 layer includes only the non-metallic first carbon-containing electrode 82 layer. In this third alternative exemplary structure, only the bit lines 12 need to be offset from the edges of the insulating layer 10 and the substrate 9. The non-metallic first electrode 92 layer (i.e., the first carbon-containing electrode 82 layer) does not need to be patterned at this process step and may cover the offset sidewalls of the bit lines 12.

The OTS material layer 84L is formed over the bit lines 12 and the first electrode 92 layer, as described above. The OTS material layer 84L is then irradiated with microwave radiation 100 to anneal the OTS material layer 84L, as described above. The above described process steps of FIGS. 6A and 6B are then carried out on the structure of FIGS. 21A and 21B to form the third alternative exemplary structure shown in FIGS. 22A and 22B.

In the fifth embodiment, the OTS material layer 84L is subjected to a microwave anneal by being irradiated by microwave radiation while sidewalls of underlying metallic layers are covered by non-metallic sidewalls spacers which comprise an oxide of the metal of the metallic layers.

Figure 23B:
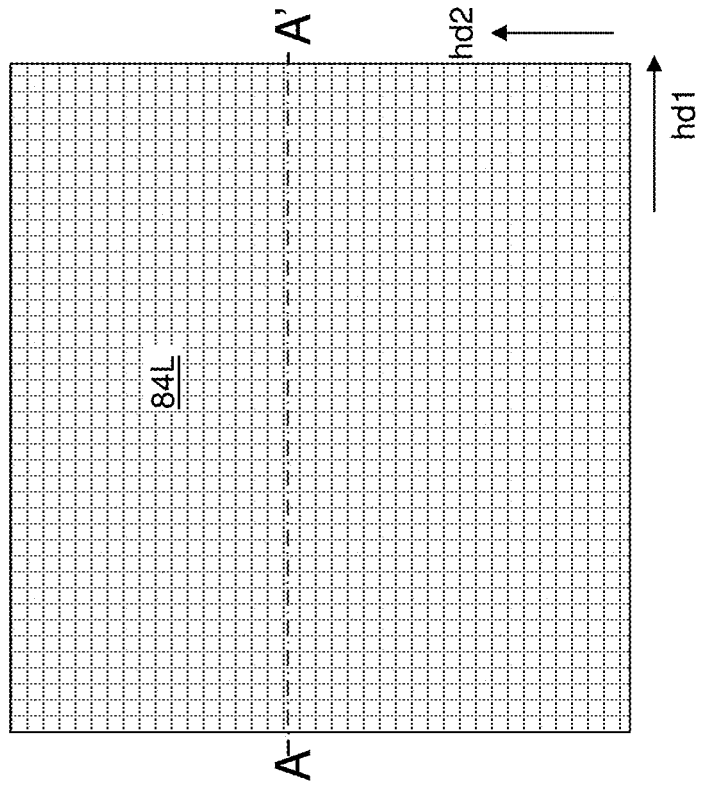
Figure 23A:
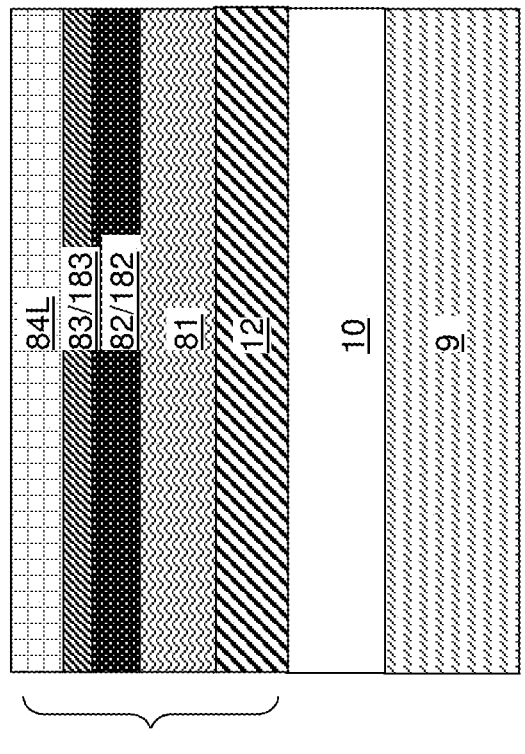

Referring to FIGS. 23A and 23B, in an exemplary structure of the fifth embodiment, the layer stack 288 of the first embodiment shown in FIGS. 3A and 3B is provided prior to patterning the layer stack into the memory pillar structures 80.

Referring to FIGS. 24A and 24B, a sacrificial masking layer 101 is formed over the OTS material layer 84L. The sacrificial masking layer 101 may comprise photoresist or a hard mask (e.g., silicon oxide, silicon nitride, etc.) layer, The layers of the stack 288 covered by the sacrificial masking layer 101 are subjected to an oxidation treatment. The oxidation treatment may comprise a thermal or plasma oxidation in an oxygen containing ambient, such as pure oxygen, $N_2O$, water vapor, etc., ambient. The oxidation treatment forms oxide sidewall spacers at the edges of some and/or all layers underlying the sacrificial masking layer.

For example, non-metallic metal oxide sidewalls spacers 212 are formed on the exposed edges (i.e., sidewalls) of the bit lines 12 at the edges of the substrate 9. The metal oxide spacers 212 may comprise an insulating oxide of a metal of the bit lines 12, such as titanium oxide, tungsten oxide, tantalum oxide, etc. Non-metallic oxide spacers 282 and/or 283 are also formed on exposed sidewalls of the first electrode 92 layer. For example, if the first electrode 92 layer includes the metal-carbon alloy electrode 182 layer, then metal oxide spacers 282 may be formed on the sidewalls of the metal-carbon alloy electrode 182 layer. The metal oxide spacers 282 comprise an oxide of the metal of the metal-carbon alloy, such as titanium oxide, tungsten oxide, tantalum oxide, etc. If the first electrode 92 layer includes the first metallic layer 83 or the first barrier layer 183, then metal oxide spacers 283 may be formed on the sidewalls of the layers 83 or 183. The metal oxide spacers 283 comprise an oxide of the metal of the layers 83 or 183, such as titanium oxide, tungsten oxide, tantalum oxide, etc.

If the first electrode 92 layer includes a carbon containing layer, such as the first carbon-based electrode 82 layer, then the edge portions (i.e., sidewalls) of the carbon containing layer may be ashed and recessed. However, since the edge portions of the first electrode 92 layer are removed during formation of the memory pillar structures 80, the ashing does not significantly affect the layers of the memory pillar structures 80. Furthermore, if the sidewalls of the OTS material layer 84L are oxidized, then such oxidized sidewalls are also removed during formation of the memory pillar structures 80. Thus, the oxidized OTS material is not included in the final memory pillar structures 80. The sacrificial masking layer 101 is removed from above the OTS material layer 84L by selective etching or another suitable method.

In an alternative method, the sacrificial masking layer 101 is formed on the first electrode 92 layer prior to forming the OTS material layer 84L. The sidewall spacers (212, 282, 283) are then formed by oxidation prior to forming the OTS material layer 84L. The sacrificial masking layer 101 is removed from above the first electrode 92 layer by selective etching or another suitable method. The OTS material layer 84L is then formed over the first electrode 92 layer.

Referring to FIGS. 25A and 25B, the OTS material layer 84L is then irradiated with microwave radiation 100 to anneal the OTS material layer 84L, as described above. The above described process steps of FIGS. 4A and 4B and 5A and 5B are then carried out on the structure of FIGS. 25A and 25B to form the fifth exemplary structure shown in FIGS. 5A and 5B. The sidewall spacers (212, 282, 283) are removed during the formation of the memory pillar structures 80.

Referring to FIGS. 26A and 26B, first alternative exemplary structure of the first alternative aspect of the fifth embodiment differs from the exemplary structure of the fifth embodiment shown in FIGS. 25A and 25B in that the first electrode 92 layer lacks any carbon containing layers. In other words, layers 82 and 182 are omitted from the first electrode 92 layer. Thus, the first electrode 92 layer comprises only metallic material, such as the first metallic layer 83. The metal oxide spacers 283 are formed on the first metallic layer 83 by the oxidation treatment. The spacers 282 are omitted in this structure.

The OTS material layer 84L is then irradiated with microwave radiation 100 to anneal the OTS material layer 84L, as described above. The above described process steps of FIGS. 4A and 4B and 5A and 5B are then carried out on the structure of FIGS. 26A and 26B to form the first alternative exemplary structure.

Referring to FIGS. 27A and 27B, in a second alternative exemplary structure of the second alternative aspect of the fifth embodiment, the memory element 81 is formed above the ovonic threshold switch material portion 84, similar to the second embodiment described above with respect to FIGS. 6A and 6B. Otherwise, the second alternative exemplary structure is the same as the exemplary structure shown in FIGS. 24A and 24B.

Referring to FIGS. 28A and 28B, the OTS material layer 84L is then irradiated with microwave radiation 100 to anneal the OTS material layer 84L, as described above. The above described process steps of FIGS. 6A and 6B are then carried out on the structure of FIGS. 28A and 28B to form the second alternative exemplary structure shown in FIGS. 6A and 6B. The sidewall spacers (212, 282, 283) are removed during the formation of the memory pillar structures 80.

Referring to FIGS. 29A and 29B, a third alternative exemplary structure of the third alternative aspect of the fifth embodiment differs from the second alternative exemplary structure of the second alternative aspect of the fifth embodiment shown in FIGS. 28A and 28B in that the first electrode 92 layer lacks any carbon containing layers. In other words, layers 82 and 182 are omitted from the first electrode 92 layer. Thus, the first electrode 92 layer comprises only metallic material, such as the first metallic layer 83. The metal oxide spacers 283 are formed on the first metallic layer 83 by the oxidation treatment. The spacers 282 are omitted in this structure.

The OTS material layer 84L is then irradiated with microwave radiation 100 to anneal the OTS material layer 84L, as described above. The above described process steps of FIGS. 6A and 6B are then carried out on the structure of FIGS. 29A and 29B to form the third alternative exemplary structure.

Figures 30A, 30B:
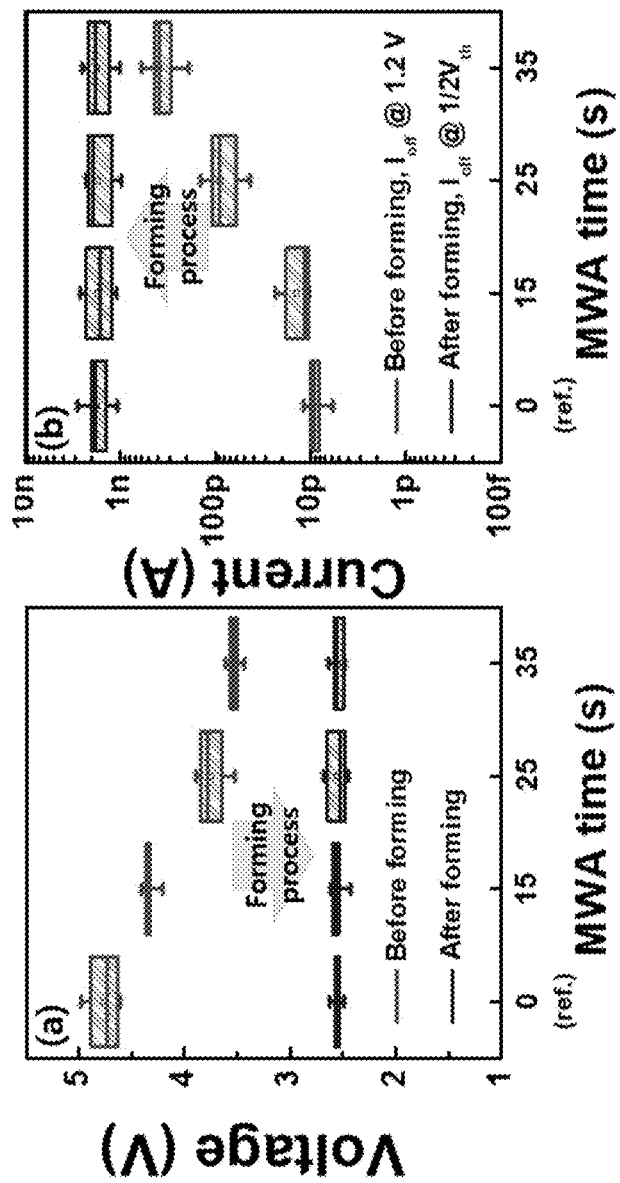
FIGS. 30A and 30B are plots of voltage in volts and current in amps, respectively, versus microwave annealing time in seconds, according to a non-limiting specific example of the present disclosure.

FIGS. 30A and 30B are plots of voltage in volts and current in amps, respectively, versus continuous microwave annealing (MWA) time in seconds according to a non-limiting specific example. The exemplary structure includes a silicon oxide substrate containing a patterned tungsten first electrode and an overlying 20 nm thick $Si_{1.5}Ge_7As_{32}Te_{46}$ OTS material layer irradiated by 1000 W microwaves in a nitrogen ambient. A bilayer carbon and tungsten second electrode is then formed on the OTS material layer after the MWA.

Referring to FIG. 30A, the forming (i.e., first fire) voltage between the electrodes is reduced compared to no MWA and also reduced with increased MWA time while the threshold voltage remains relatively constant after the forming voltage is applied. Thus, there was no significant change in the threshold voltage after the MWA compared to without the MWA. Referring to FIG. 30B, the off current is increased from 10 pA at a voltage of about 1.2V without MWA to about 0.5 nA at a voltage of about 1.2V after a 35 second MWA before the forming voltage is applied. However, the off current remains relatively constant at between about 0.5 nA and about 1 nA (e.g., about 0.8 nA) at a voltage of about 1.1V (which is about half of the threshold voltage) after the forming voltage is applied.

FIGS. 31A and 31B are plots of voltage in volts and current in amps, respectively, versus annealing time according to the non-limiting specific example described above and according to a comparative example. In the comparative example, the above described 20 nm thick $Si_{1.5}Ge_7As_{32}Te_{46}$ OTS material layer is subjected to a conventional thermal annealing (CTA) which comprises rapid thermal annealing (RTA) at 200 degrees Celsius for 15 to 60 minutes. As described above, for the microwave annealed specific example, the first fire voltage decreases with increasing MWA time. In contrast, for the CTA comparative example, the first fire voltage increases with increasing RTA time, as shown in FIG. 31A. As described above, for the microwave annealed specific example, the current increases with increasing MWA time. In contrast, for the CTA comparative example, the current decreases with increasing RTA time, as shown in FIG. 31B. Thus, the microwave annealed specific example exhibits unexpected results compared to the CTA comparative example.

FIGS. 32A and 32B are Raman spectroscopy spectra of the non-limiting specific example before and after a 35 second MWA, and of the comparative example before and after a 60 minute RTA, respectively. Compared to the as-deposited OTS material layer, the CTA (i.e., RTA) treated OTS material layer showed a $GeTe_4$ peak (122 cm$^{-1}$) and a Ge—Te vibration peak (141 cm$^{-1}$). In contrast, in the MWA treated OTS material layer, the As—As bonding peaks (~190 and 230 cm$^{-1}$) were decreased, and an $AsTe_3$ peak (155-160 cm$^{-1}$) was sharply increased, compared to the as-deposited OTS material layer.

Furthermore the RTA treated OTS material layer exhibited an increased optical band gap while the MWA treated OTS material layer exhibited a decreased optical band gap, compared to the as-deposited OTS material layer. Without wishing to be bound by a particular theory, it is believed that the CTA (i.e., RTA) increases Ge—Te bonding (which tends to increase the optical band gap), while the MWA increases As—Te bonding (which tends to decrease the optical band gap).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method, comprising:
   forming a first electrode layer over a substrate;
   forming an ovonic threshold switch (OTS) material layer over the first electrode layer;
   microwave annealing the OTS material layer; and
   forming a second electrode layer over the OTS material layer.

2. The method of claim 1, wherein the microwave annealing the OTS material layer occurs without exposing any metallic material to microwave radiation during the microwave annealing.

3. The method of claim 2, further comprising forming bit lines over the substrate prior to forming the first electrode layer, wherein the first electrode layer is formed over the bit lines.

4. The method of claim 3, further comprising:
   patterning the bit lines such that ends of the bit lines are recessed from edges of the substrate; and
   covering the recessed ends of the bit lines with at least one overlying non-metallic layer prior to the microwave annealing, such that the metallic material of the bit lines is not exposed to the microwave radiation.

5. The method of claim 4, wherein the at least one overlying non-metallic layer comprises the OTS material layer.

6. The method of claim 4, wherein the at least one overlying non-metallic layer comprises a non-metallic carbon-based electrode layer of the first electrode layer.

7. The method of claim 4, further comprising patterning the first electrode layer such that edges of the first electrode layer are recessed from the edges of the substrate.

8. The method of claim 7, further comprising covering the recessed edges of the first electrode layer with the at least one overlying non-metallic layer prior to the microwave annealing, such that the metallic material of the first electrode layer is not exposed to the microwave radiation.

9. The method of claim 8, wherein the at least one overlying non-metallic layer comprises the OTS material layer.

10. The method of claim 3, further comprising oxidizing ends of the bit lines to form non-metallic metal oxide sidewall spacers on the ends of the bit lines prior to the microwave annealing, such that the metallic material of the bit lines is not exposed to the microwave radiation.

11. The method of claim 1, further comprising oxidizing edges of the first electrode layer to form non-metallic metal oxide sidewall spacers on the edges of the first electrode layer prior to the microwave annealing, such that a metallic material of the first electrode layer is not exposed to the microwave radiation.

12. The method of claim 1, wherein the first electrode layer consists essentially of a non-metallic first carbon-based electrode layer.

13. The method of claim 1, wherein the microwave annealing reduces a first fire voltage of the OTS material layer.

14. The method of claim 1, wherein the microwave annealing reduces a threshold voltage drift of the OTS material layer.

15. The method of claim 1, wherein the microwave annealing reduces an optical band gap and increases an amount of arsenic-tellurium bonding in the OTS material layer.

16. The method of claim 1, wherein the microwave annealing generates conducting clusters in the OTS material layer.

17. The method of claim 1, wherein the microwave annealing comprises pulsed microwave annealing.

18. The method of claim 1, wherein the microwave annealing comprises continuous microwave annealing.

19. The method of claim 1, wherein the OTS material layer comprises a GeSeAsTe material.

20. The method of claim 1, further comprising:
   forming a magnetoresistive random access memory (MRAM) memory element layer above the second electrode layer or below the first electrode layer; and
   patterning the MRAM memory element layer, the first electrode layer, the OTS material layer and the second electrode layer into memory pillar structures.

* * * * *